(12) United States Patent
Hegg

(10) Patent No.: US 12,144,093 B2
(45) Date of Patent: Nov. 12, 2024

(54) MICROWAVE SUPPRESSION TUNNEL AND RELATED FEATURES

(71) Applicant: A.L.M. Holding Co., Onalaska, WI (US)

(72) Inventor: Vernon R. Hegg, Plymouth, MN (US)

(73) Assignee: A.L.M. Holding Company, Onalaska, WI (US)

( * ) Notice: Subject to any disclaimer, the term of this patent is extended or adjusted under 35 U.S.C. 154(b) by 0 days.

(21) Appl. No.: 18/208,981

(22) Filed: Jun. 13, 2023

(65) Prior Publication Data

US 2023/0345593 A1    Oct. 26, 2023

Related U.S. Application Data

(62) Division of application No. 16/918,411, filed on Jul. 1, 2020.

(Continued)

(51) Int. Cl.
*H05B 6/76* (2006.01)
*A23L 3/00* (2006.01)
(Continued)

(52) U.S. Cl.
CPC .............. *H05B 6/76* (2013.01); *A23L 3/001* (2013.01); *A23L 3/54* (2013.01); *E01C 19/08* (2013.01); *E01C 19/20* (2013.01); *H05B 6/6426* (2013.01); *H05B 6/784* (2013.01); *H05K 9/0056* (2013.01); *H05K 9/009* (2013.01); *A23V 2002/00* (2013.01); *E01C 19/1004* (2013.01); *E01C 2019/208* (2013.01); *H05B 6/707* (2013.01); *H05B 2206/044* (2013.01); *H05B 2206/046* (2013.01)

(58) Field of Classification Search
CPC ...... E01C 19/08; E01C 19/20; E01C 19/1004; E01C 2019/208
See application file for complete search history.

(56) References Cited

U.S. PATENT DOCUMENTS 3,239,643 A    3/1966    Kluck
3,665,141 A    5/1972    Schiffmann et al.
(Continued)

FOREIGN PATENT DOCUMENTS

CA    2051445 A1    10/1990
CA    2660700 A1    2/2008
(Continued)

OTHER PUBLICATIONS

Communication pursuant to Article 94(3) EPC from counterpart European Application No. 20745386.1, dated Nov. 8, 2023, 4 pp.
(Continued)

*Primary Examiner* — Abigail A Risic
(74) *Attorney, Agent, or Firm* — Kagan Binder, PLLC

(57) ABSTRACT

A continuous asphalt mix system for using a microwave heating vessel at the point of production that includes a microwave energy suppression tunnel with one or more mesh flaps for substantially reducing or preventing the leakage of microwave energy from a microwave system, while having a continuous flow of product through the vessel and suppression tunnels. The suppression tunnels are installed on the inlet and/or the outlet side of the system and are sized to suppress leakage.

20 Claims, 18 Drawing Sheets

Related U.S. Application Data

(60) Provisional application No. 62/869,305, filed on Jul. 1, 2019.

(51) Int. Cl.

| | | |
|---|---|---|
| *A23L 3/54* | (2006.01) | |
| *E01C 19/08* | (2006.01) | |
| *E01C 19/10* | (2006.01) | |
| *E01C 19/20* | (2006.01) | |
| *H05B 6/64* | (2006.01) | |
| *H05B 6/78* | (2006.01) | |
| *H05K 9/00* | (2006.01) | |
| *H05B 6/70* | (2006.01) | |

(56) References Cited

U.S. PATENT DOCUMENTS

| | | | |
|---|---|---|---|
| 3,774,003 A | 11/1973 | Kaufman | |
| 3,856,275 A | 12/1974 | Dydzyk | |
| 4,176,267 A | 11/1979 | Rueggeberg | |
| 4,180,718 A | 12/1979 | Hanson | |
| 4,246,462 A * | 1/1981 | Meisel | H05B 6/782 |
| | | | 219/746 |
| 4,252,459 A | 2/1981 | Jeppson | |
| 4,253,005 A | 2/1981 | Gordon et al. | |
| 4,276,093 A | 6/1981 | Pickermann | |
| 4,319,856 A | 3/1982 | Jeppson | |
| 4,338,869 A * | 7/1982 | Hoskinson | F23G 5/00 |
| | | | 110/346 |
| 4,488,027 A | 12/1984 | Dudley et al. | |
| 4,619,550 A | 10/1986 | Jeppson | |
| 4,808,782 A | 2/1989 | Nakagawa et al. | |
| 4,861,955 A | 8/1989 | Shen | |
| 5,083,870 A | 1/1992 | Sindelar et al. | |
| 5,092,706 A | 3/1992 | Bowen et al. | |
| 5,120,217 A * | 6/1992 | O'Brien | E01C 19/08 |
| | | | 432/13 |
| 5,242,493 A | 9/1993 | Glynn et al. | |
| 5,270,000 A | 12/1993 | Goldner et al. | |
| 5,303,999 A | 4/1994 | Nath et al. | |
| 5,447,388 A | 9/1995 | Rouse | |
| 5,810,471 A | 9/1998 | Nath et al. | |
| 5,902,510 A | 5/1999 | Balbaa et al. | |
| 6,186,700 B1 | 2/2001 | Omann | |
| 6,207,462 B1 | 3/2001 | Barclay et al. | |
| 6,349,658 B1 | 2/2002 | Tyer | |
| 6,455,826 B1 | 9/2002 | Araya et al. | |
| 6,618,957 B2 | 9/2003 | Novak et al. | |
| 6,768,089 B2 | 7/2004 | Minobe et al. | |
| 7,081,605 B2 | 7/2006 | Fritts et al. | |
| 7,432,483 B2 | 10/2008 | Wilson | |
| 7,758,235 B1 | 7/2010 | Collette | |
| 7,927,465 B2 | 4/2011 | Novak | |
| 7,931,806 B2 | 4/2011 | Logan et al. | |
| 8,101,893 B2 | 1/2012 | Bogdan | |
| 8,490,904 B2 | 7/2013 | Liubakka et al. | |
| 8,575,525 B2 | 11/2013 | Mackay et al. | |
| 8,585,788 B2 | 11/2013 | Drozd et al. | |
| 8,586,898 B2 | 11/2013 | Novak | |
| 9,314,231 B2 | 4/2016 | O'Neil et al. | |
| 9,624,625 B2 | 4/2017 | Coe | |
| 9,642,194 B2 | 5/2017 | Wilber et al. | |
| 10,081,920 B2 | 9/2018 | Coe | |
| 10,155,866 B2 | 12/2018 | Le et al. | |
| 10,214,786 B2 | 2/2019 | Logan et al. | |
| 10,239,331 B1 | 3/2019 | Gervais et al. | |
| 10,294,616 B2 | 5/2019 | Crupi et al. | |
| 11,198,977 B2 | 12/2021 | Eliot | |
| 2002/0046474 A1 | 4/2002 | Novak et al. | |
| 2002/0191481 A1 | 12/2002 | Cox et al. | |
| 2007/0122235 A1 | 5/2007 | Kasahara et al. | |
| 2010/0020630 A1 | 1/2010 | Musil | |
| 2011/0290788 A1 | 12/2011 | Klemarewski | |
| 2012/0029252 A1 | 2/2012 | Lissianski et al. | |
| 2013/0056987 A1 | 3/2013 | Novak | |
| 2013/0336720 A1 | 12/2013 | Jack et al. | |
| 2013/0343145 A1 | 12/2013 | Villalobos Davila | |
| 2014/0119829 A1 | 5/2014 | Eliot | |
| 2014/0146632 A1 | 5/2014 | Eliot | |
| 2014/0263779 A1 | 9/2014 | Svec et al. | |
| 2015/0164108 A1 | 6/2015 | Logan et al. | |
| 2015/0237684 A1 | 8/2015 | Huber | |
| 2017/0182531 A1 | 6/2017 | Hurlin et al. | |
| 2018/0017323 A1 * | 1/2018 | Whitney | F26B 21/005 |
| 2018/0187385 A1 | 7/2018 | Reinke et al. | |
| 2018/0343713 A1 * | 11/2018 | Swiergon | H05B 6/80 |
| 2019/0017233 A1 | 1/2019 | Coe | |
| 2019/0100886 A1 * | 4/2019 | Eliot | E01C 19/10 |
| 2019/0274195 A1 | 9/2019 | Magana | |
| 2019/0320508 A1 | 10/2019 | Vickers et al. | |
| 2019/0373926 A1 | 12/2019 | Druga et al. | |
| 2021/0007190 A1 | 1/2021 | Hegg | |
| 2022/0136183 A1 | 5/2022 | Eliot | |
| 2022/0256662 A1 | 8/2022 | Frederixon et al. | |
| 2023/0074184 A1 | 3/2023 | Frederixon et al. | |
| 2023/0126550 A1 | 4/2023 | Frederixon et al. | |
| 2023/0210145 A1 | 7/2023 | Frederixon et al. | |
| 2023/0211040 A1 | 7/2023 | Frederixon et al. | |
| 2023/0328853 A1 | 10/2023 | Hegg | |
| 2024/0080950 A1 | 3/2024 | Frederixon et al. | |

FOREIGN PATENT DOCUMENTS

| | | |
|---|---|---|
| CL | 2017000155 A1 | 7/2017 |
| CL | 2023000379 A1 | 7/2023 |
| CN | 201172789 Y | 12/2008 |
| CN | 102658077 A | 9/2012 |
| CN | 102690699 A | 9/2012 |
| CN | 106309136 A | 1/2017 |
| CN | 206204738 U | 5/2017 |
| CN | 108547199 A | 9/2018 |
| CN | 107673927 B | 10/2018 |
| DE | 2627588 B2 | 12/1977 |
| DE | 3505570 C1 | 1/1991 |
| EP | 0529285 A1 | 7/1992 |
| EP | 1611788 A1 | 1/2006 |
| EP | 2689833 A2 | 1/2014 |
| EP | 2920533 B1 | 6/2018 |
| EP | 2318487 B1 | 5/2019 |
| FR | 2522798 A1 | 9/1983 |
| FR | 2755450 A1 | 5/1998 |
| JP | S45-014954 B | 5/1970 |
| JP | S50-154545 U | 12/1975 |
| JP | S52-97653 U | 7/1977 |
| JP | S61-158091 U | 9/1986 |
| JP | H06-000147 B | 1/1994 |
| JP | H07-505193 A | 6/1995 |
| JP | 2008518930 A | 6/2008 |
| KR | 2010-0133842 A | 12/2010 |
| KR | 101030187 B1 | 4/2011 |
| KR | 101089213 B1 | 12/2011 |
| KR | 101251102 B1 | 4/2013 |
| WO | 90/12602 A1 | 11/1990 |
| WO | WO 93/09647 A1 | 5/1993 |
| WO | 93/10952 A1 | 6/1993 |
| WO | WO 96/34241 A1 | 10/1996 |
| WO | WO 2006/050122 A1 | 5/2006 |
| WO | WO 2006/057563 A1 | 6/2006 |
| WO | WO 2011/036773 A1 | 3/2011 |
| WO | WO 2013/166489 A1 | 11/2013 |
| WO | WO 2013/166490 A2 | 11/2013 |
| WO | 2016/003583 A1 | 1/2016 |
| WO | 2016/012334 A1 | 1/2016 |
| WO | WO 2017/165664 A1 | 9/2017 |
| WO | WO 2018/154094 A1 | 8/2018 |
| WO | WO 2020/106263 A1 | 5/2020 |
| WO | WO 2021/003250 A2 | 1/2021 |
| WO | WO 2022/245348 A1 | 11/2022 |
| WO | WO 2022/250663 A1 | 12/2022 |
| WO | WO 2023/069159 A1 | 4/2023 |
| WO | 2023/133182 A1 | 7/2023 |

(56) References Cited

FOREIGN PATENT DOCUMENTS

| WO | 2023/133186 A1 | 7/2023 |
|---|---|---|
| WO | 2023/249650 A2 | 12/2023 |

OTHER PUBLICATIONS

Substantive Report from counterpart Chilean Application No. 202103591, dated Oct. 10, 2023, 34 pp.
U.S. Appl. No. 17/782,830, filed Jun. 6, 2022, naming inventors Drew J. Frederixon et al.
"Animal Feeding Operations—Uses of Manure," National Pollutant Discharge Elimination System (NPDES), United States Environmental Protection Agency (EPA), Jan. 2022, 12 pp.
"Animal Product Manual" from the USDA Animal and Plant Health Inspection Service, U.S. Department of Agriculture, Second Edition issued 2014, 730 pp. (Filed in 8 parts).
"Bedding Options for Dairy Cows," UMass Extension Crops, Dairy, Livestock, and Equine Program, CDLE Pub. 11-48, retrieved from https://ag.umass.edu/sites/ag.umass.edu/files/fact-sheets/pdf/BeddingOptionsforDairyCows(11-48 on Dec. 28, 2021, 2 pp.
"Conveyorized Modular Industrial Microwave Power Systems," from Thermex Thermatron, accessed from https://thermex-thermatron.com/industrial-microwave-systems, on Apr. 10, 2019, 1 pp.
"DM-6: Lesson 12 Physical Methods—Thermal Processing," Module 4. Microbiology of food preservation, from Food and Industrial Microbiology, Nov. 2012, retrieved from http://ecoursesonline.iasri.res.in/mod/page/view.php?id=5130 on Jan. 2021, 10 pp.
"Environmental Regulations and Technology—Control of Pathogens and Vector Attraction in Sewage Sludge," United States Environmental Protection Agency (EPA) Section 503.32, Jul. 2003, 186 pp.
European Union Animal By-Products Regulations (Regulation 1069/2009), Oct. 2009, 62 pp.
"Food Additive Status List," United States Food and Drug Administration (FDA) Food Additive Status List, retrieved from https://www.fda.gov/food/food-additives-petitions/food-additive-status-list current as of Aug. 2021, retrieved Jan. 2022, 99 pp.
"Food additives," from the World Health Organization dated Jan. 31, 2018, retrieved from https://who.it/news-room/fact-sheets/detail/food-additives on Dec. 29, 2021, 4 pp.
"Good Practices for the Feed Industry, Implementing the Codex Alimentarius Code of Practice on Good Animal Feeding," FAO Animal Production and Health Manual, Food and Agriculture Organization of the United Nations and International Feed Industry Federation, 2010, 106 pp.
"Heating, ventilation, and air conditioning," Wikipedia, retrieved from https://en.wikipedia.org/wiki/Heating,_ventilation,_and_air_conditioning on Sep. 7, 2020, 17 pp.
"Industrial Microwaves Information—Industrial Microwave Systems Components," from Cellencor, Apr. 10, 2019, 1 pp.
"Seed Heat-Treatment: A Management Strategy for Controlling Bacterial Diseases," Sustainable Farming on the Urban Fringe, Jan. 2012, retrieved from https://sustainable-farming.rutgers.edu/seed-heat-treatment-manage-bacterial-diseases/ on Apr. 20, 2022, 4 pp.
"Mechanical Heat Treatment of Municipal Solid Waste," from Department for Environment Food and Rural Affairs (Defra), 2007, 32 pp.
"Thermal Pre-treatment of Biomass for Large-scale Applications, Summary and Conclusions form the IEA Bioenergy ExCo66 Workshop," IEA Bioenergy: ExCo: 2011:05, Oct. 2010, 24 pp.
Whitepaper entitled "Thermal Processing of Food," from Safefood 360°, Inc., 2014, 23 pp.
Aramideh, S., "Numerical simulation of biomass fast pyrolysis in fluidized bed and auger reactors," Thesis for degree of Master of Science at Iowa State University, Jan. 2014, 121 pp.
Baiano, A., "Recovery of Biomolecules from Food Wastes—A Review," Molecules, vol. 19, No. 9, Sep. 2014, 22 pp.
Code of Federal Regulations, Chapter 21, Part 112—Standards for the Growing, Harvesting, Packing, and Holding of Produce for Human Consumption, May 2022, 50 pp.
Code of Federal Regulations, Chapter 40, Part 503—Standards for the Use of Disposal of Sewage Sludge, May 2022, 47 pp.
Carlson et al., "Bedding Recovery From Manure: The Solution To Livestock Bedding," Feeco International, retrieved from https://feeco.com/bedding-recovery-from-manure-the-solution-to-livestock-bedding/ on Dec. 28, 2021, 5 pp.
Data Sheet entitled "80dB Stainless steel RFI shielding Aaronia X-Steel," from Aaronia AG, Rev. 1.6, dated Jan. 6, 2015, 3 pp.
Data Sheet entitled "Fireproof Shielding Fabric Aaronia Mesh," from Aaronia AG, Rev. 1.1, dated Sep. 19, 2014, 3 pp.
Doran et al., "Chapter 7. Treatments to Promote Seed Germination," from Handbook on Seeds of Dry-Zone Acacias: A Guide for Collecting, Extracting, Cleaning, and Storing the Seed and for Treatment to Promote Germination of Dry-zone Acacias, 1983, retrieved from http://www.fao.org/3/q2190e/q2190e07.htm on Apr. 20, 2022, 11 pp.
Drygas et al., "The impact of heat treatment on the components of plant biomass as exemplified by Junniperus sabina dn Picea abies," Econtechmod: An International Quarterly Journal on Economics of Technology and Modelling Processes, vol. 5, No. 3, Jul. 2016, 10 pp.
European Directive 86/278/EEC of Jun. 12, 1986 on the protection of the environment, and in particular of the soil, when sewage sludge is used in agriculture, Document 31986L0278, 7 pp.
European Directive 91/271/EEC of May 21, 1991 concerning urban waste-water treatment, Document 31991L0271, 13 pp.
European Directive 2008/98/EC of the European Parliament and of the Council of Nov. 19, 2008 on waste and repealing certain Directives (Text with EEA relevance), Document 32008L0098, 28 pp.
Hassani et al., "The influence of microwave irradiation on rocks for microwave-assisted underground excavation," Journal of Rock Mechanics and Geotechnical Engineering, vol. 8, No. 1, Dec. 2015, 15 pp.
International Search Report and Written Opinion of International Application No. PCT/US2020/040464, mailed Jan. 26, 2021, 27 pp.
International Preliminary Report on Patentability for International Application No. PCT/US2020/040464, mailed Jan. 13, 2022, 18 pp.
Jankovic et al., "The Effects of Microwave Radiation on Microbial Cultures," Hospital Pharmacology—International Multidisciplinary Journal, vol. 1, No. 2, Jan. 2014, pp. 102-108.
John et al., "Understanding microwave induced sorting of porphyry copper ores," Minerals Engineering, vol. 84, Dec. 2015, 37 pp.
Kingman, S., "Recent developments in microwave processing of minerals," International Materials Reviews, vol. 51, No. 1, Feb. 2006, 12 pp.
Koleini et al., Chapter 4, "Microwave Heating Applications in Mineral Processing," The Development and Application of Microwave Heating, Edited by Wenbin Cao, Nov. 2012, 26 pp.
Kostas et al., "The application of microwave heating in bioenergy: A review on the microwave pre-treatment and upgrading technologies for biomass," Renewable and Sustainable Energy Reviews, vol. 77, Apr. 2017, 63 pp. (Paper).
Kouhkannejad, M., "Post-thermal application of feed additives," from All About Feed, Aug. 17, 2020, retrieved from https://www.allaboutfeed.net/animal-feed/feed-processing/post-thermal-application-of-feed-additives/ on Apr. 20, 2022, 6 pp.
Kwong et al., "Combustion of Biomass in Fluidized Beds: A Review of Key Phenomena and Future Perspectives," Energy & Fuels, vol. 35, No. 20, Oct. 2021, 32 pp.
Leach et al., "Recycling manure as cow bedding: Potential benefits and risks for UK dairy farms," The Veterinary Journal, vol. 206, No. 2, Nov. 2015, 8 pp.
Li et al., "Effectiveness of microwave-assisted thermal treatment in the extraction of gold in cyanide tailings," Journal of Hazardous Materials, vol. 384, Oct. 2019, 3 pp. Abstract Only.
Masthoff et al., "A systematic review of the effect of thermal processing on the allergenicity of tree nuts," Allergy European Journal of Allergy and Clinical Immunology, vol. 68, No. 8, Aug. 2013, 11 pp.

(56) References Cited

OTHER PUBLICATIONS

McGrath, M., "Heat Treating Seeds for Disease Management," by Cornell University, retrieved from http://vegetablemdonline.ppath.cornell.edu/NewsArticles/Hot-Water-Seed-Trt_McGrath_2016-17f56dy.pdf on Apr. 20, 2022, 38 pp.

Ozkoc et al., "Chapter 20—Recent Developments in Microwave Heating," Emerging Technologies for Food Processing (Second Edition), Aug. 2014, 23 pp.

Reyes et al., "Heat-Assisted Batch Settling of Mineral Suspensions in Inclined Containers," Minerals, vol. 9, No. 4, Apr. 2019, 19 pp.

Satish, H., "Exploring Microwave Assisted Rock Breakage for Possible Space Mining Applications," Thesis for the degree of Master of Engineering, for McGill University, Jun. 2005, 128 pp.

Setyawan, E., "Torrefaction of Biomass: An Overview," BioEnergy Consult—Powering a Greener Future, Jan. 2022, 7 pp.

Smeenk et al., "Experience with Atmospheric Fluidized Bed Gasification of Switchgrass," BioEnergy '98 conference, Dec. 1998, 9 pp. found at https://www.osti.gov/servletspurl/334227.

Taqi et al., "Understanding microwave heating in biomass-solvent systems," Chemical Engineering Journal, vol. 393, Mar. 2020, 10 pp.

Teimoori et al., "Twenty years of experimental and numerical studies on microwave-assisted breakage of rocks and minerals—a review," arXiv: Applied Physics, Nov. 2020, 43 pp.

Tumuluru et al., "Formulation, Pretreatment, and Densification Options to Improve Biomass Specifications for Co-Firing High Percentages with Coal," Industrial Biotechnology, vol. 8, No. 3, Jun. 2012, 20 pp.

United States Code, Title 33, Navigation and Navigable Waters, Chapter 26, Water Pollution Prevention and Control, 1972, 233 pp. (Filed in 10 parts).

Vorster, W., "The Effect of Microwave Radiation on Mineral Processing," Thesis for the degree of Doctor of Philosophy at the University of Birmingham, Jun. 2001, 256 pp.

Vorster et al., "The effect of microwave radiation upon the processing of Neves Corvo copper ore," International Journal of Mineral Processing, vol. 63, No. 1, Jun. 2001, pp. 29-44. (Abstract Only).

Wang et al., "Impact of Thermal Pretreatment Temperatures on Woody Biomass Chemical Composition, Physical Properties, and Microstructure," Energies, vol. 11, No. 1, Dec. 2017, 20 pp.

Wisconsin Department of Natural Resources (WI DNR) Chapter NR 204—Domestic Sewage Sludge Management, May 2011, No. 665, May 2011, 13 pp.

Zafar, S., "Thermal Conversion of Biomass," BioEnergy Consult—Powering a Greener Future, Sep. 2021, 10 pp.

Zhang et al., "Liquefaction of Biomass and Upgrading of Bio-Oil: A Review," Molecules, vol. 24, No. 12, Jun. 2019, 30 pp.

Office Action from counterpart Canadian Application No. 3,145,256, dated Feb. 28, 2024, 4 pp.

Office Action from counterpart Israeli Application No. 289465, dated Dec. 20, 2023, 7 pp.

Substantive Examination Report from counterpart Saudi Arabia Application No. 521431280, dated Dec. 28, 2023, 7 pp.

Office Action from counterpart China Application No. 202080611494, dated Mar. 28, 2024, 18 pp.

Substantive Report from counterpart Chilean Application No. 202103591, dated Apr. 10, 2024, 29 pp.

Office Action from counterpart Japanese Application No. 2021-577981, dated Jun. 11, 2024, 13 pp.

\* cited by examiner

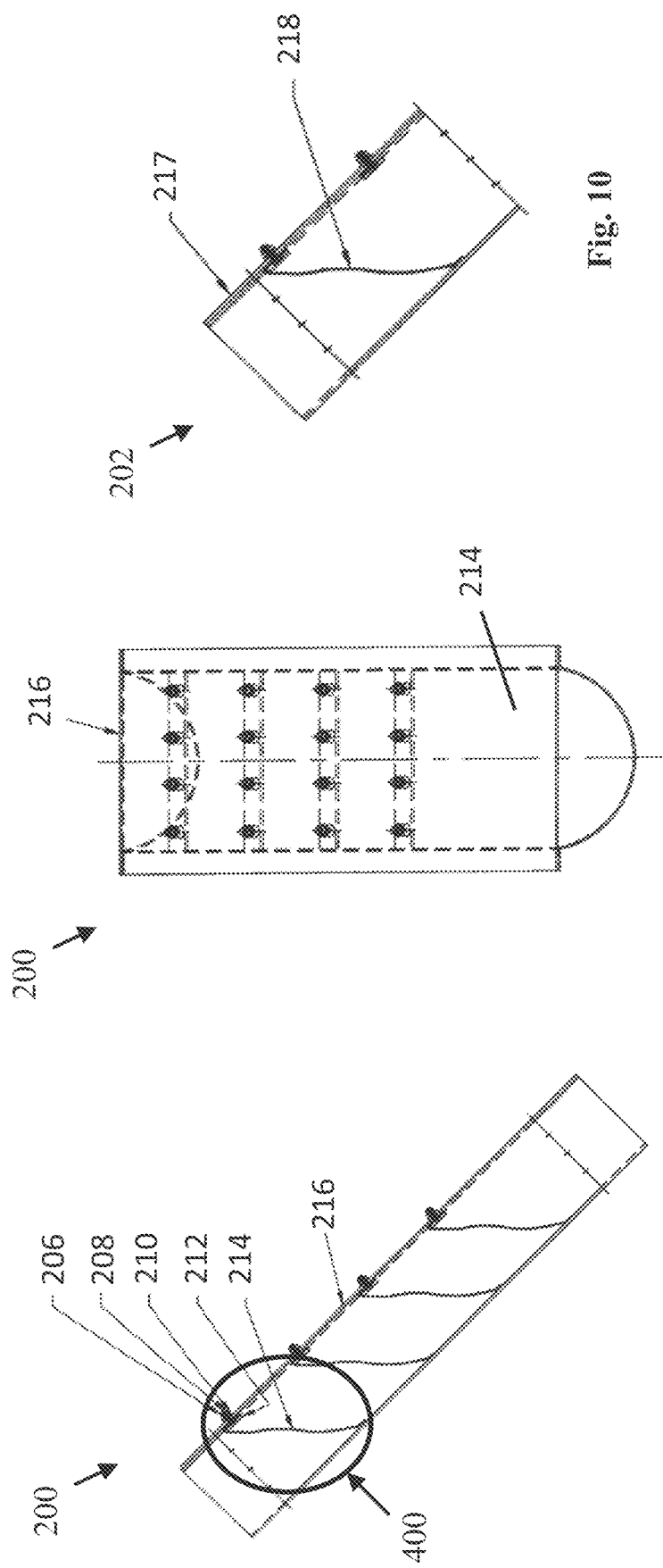

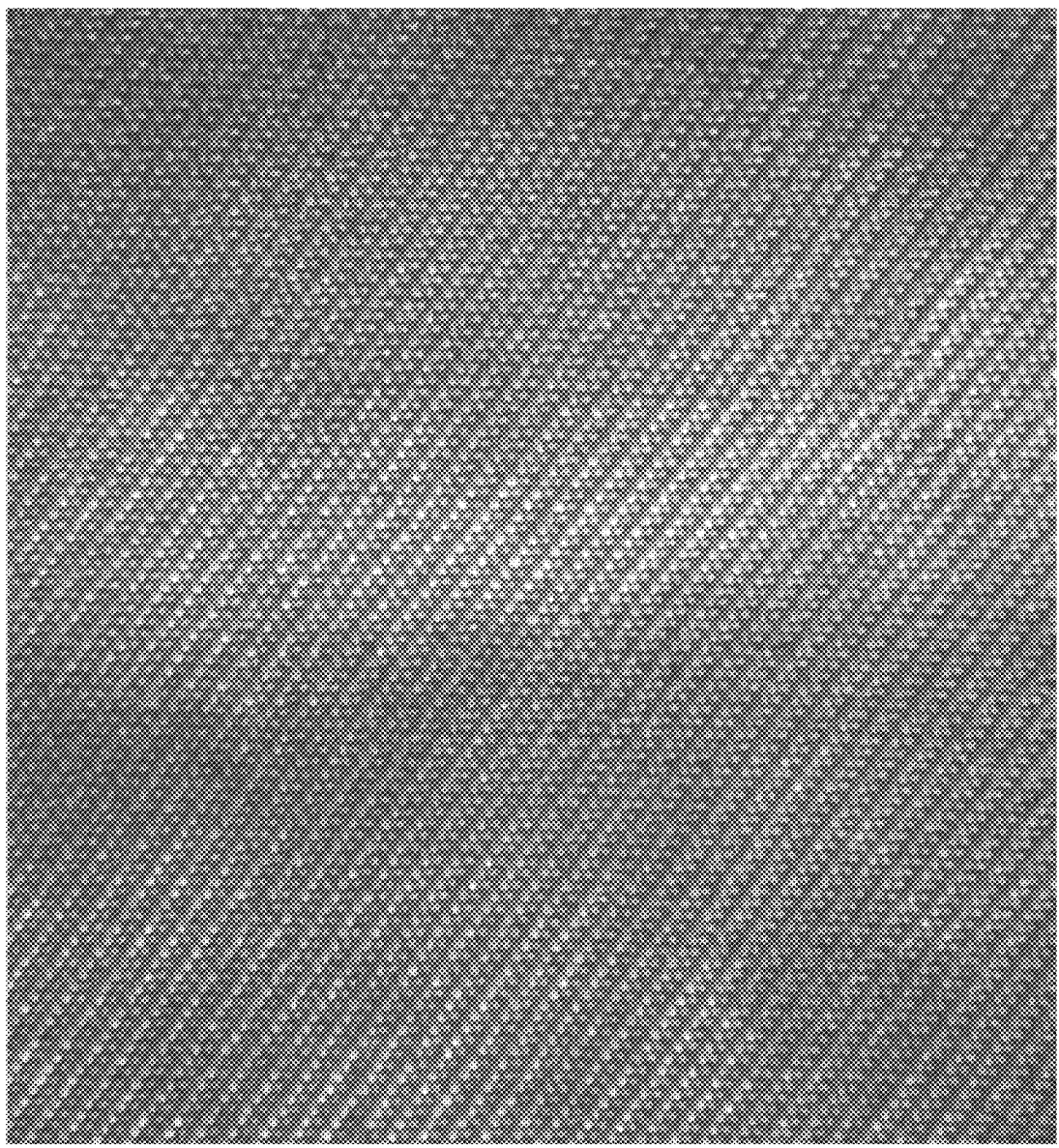
Fig. 18

MICROWAVE SUPPRESSION TUNNEL AND RELATED FEATURES

CROSS-REFERENCE TO RELATED APPLICATIONS

The present application is a Divisional Application of U.S. patent application Ser. No. 16/918,411, filed Jul. 1, 2020, which claims the benefit of U.S. Provisional Patent Application with Ser. No. 62/869,305 titled "MICROWAVE SUPPRESSION TUNNEL AND RELATED FEATURES" filed Jul. 1, 2019, the entire contents of which are incorporated by reference for all purposes herein.

BACKGROUND

Microwave energy can be radiated within an enclosure to process materials. Molecular agitation within the material resulting from its exposure to microwave energy provides energy to heat or dry the material.

Some government agencies allocate frequency bands centered at 915 MHz and 2450 MHz for use in microwave heating systems. The intensity of the microwave energy that is permitted to leak is sometimes restricted to less than 10 milliwatts (mW) per centimeter squared.

Many industrial microwave heating applications require that there be access apertures into the enclosure so that materials may be continuously transported utilizing such as, for example, a conveyor unit or other mechanism. There is a desire for suppression of microwave energy from these apertures. Continuous microwave heating arrangements have presented a problem that is more complex than the suppression of microwave energy from a simpler batch microwave system.

While applying microwave heating to moisture-containing particles, a problem can include preventing microwaves from escaping to an inlet and/or an outlet/discharge region from a channel or region where the microwaves are applied. This can be handled at present by introducing material through a metal grate including two by two inch square metal channels. The same type of grate and channels can be employed on an outlet end. However, these grates have limitations. For example, granular materials or particles (such as moisture-laden granular materials) are sometimes introduced through a square channel system. In these systems, a blockage or slowdown in the process can occur.

Other technological approaches are currently used to prevent the danger of microwave emissions, but can be less flexible than desirable. For example, other ways of suppressing microwave energy from escaping from a microwave system as a product or material is moving through can include, for example, water jackets or reflectors. There remains a desire to improve microwave suppression, especially in continuous microwave heating systems.

SUMMARY

The present disclosure relates to a continuous heating system for manufacturing asphalt mix (in Europe, asphalt mix or finished asphalt mix are typically referred to as bituminous mix or finished bituminous mix; those skilled in the art readily understand this distinction). In particular, this disclosure relates to a continuous asphalt mix system for using a microwave heating process at the point of production.

Also disclosed are embodiments of a microwave energy suppression tunnel with one or more flexible or bendable metallic (e.g., steel) coated mesh flaps for substantially reducing or preventing the leakage of microwave energy from a microwave vessel, e.g., of a conveyor unit, while having a continuous flow of product or material through the vessel and suppression tunnels. The suppression tunnels can be installed on the inlet and/or the outlet side of the vessel and are sized to suppress leakage of the product and/or microwaves produced by the microwave system, whatever the size of the product.

Stated differently, embodiments of the present invention include the addition of at least one microwave energy suppression tunnel configured for substantially preventing the leakage of microwave energy from one or more access openings in a microwave energized system while the product or material to be heated is flowing continuously through the microwave vessel, including, for example, a trough of a conveyor unit also fitted with a helical auger. The suppression tunnel can be used at inlets and/or outlets of the microwave energized system, and in some examples each suppression tunnel comprises a rectangular, U-shaped, or other suitably shaped tunnel about three feet or more in length installed flat or at an angle of preferably no more than about 45 degrees with multiple plies or layers of steel or other microwave material, such as metallic shielding mesh attached to the inner top of the rectangular or U-shaped tunnel or trough. The size of object/materials to be heated can be used as a guideline for adjusting tunnel or trough size for various embodiments. The tunnel and trough of the heating system can be sized and shaped differently in various embodiments.

Flexible or bendable mesh shielding (e.g., in the form of flaps) can be spaced at about six-inch intervals and be the same cross-sectional size as the tunnel in which they are mounted. Other intervals and spacing are also contemplated. The shielding mesh preferably operates and absorb, deflect, or block various frequency ranges, preferably from about 1 MHz to 50 GHz in radio frequency (RF) and low frequency (LF) electric fields.

According to a first aspect of the present disclosure, a microwave suppression system is disclosed. According to the first aspect, the microwave suppression system includes at least an inlet and an outlet. The microwave suppression system also includes a tunnel within at least one of the inlet and outlet that comprises at least one movable mesh flap within the tunnel. According to the first aspect, the at least one movable mesh flap is configured to absorb, deflect, or block microwave energy. Also according to the first aspect, the at least one movable mesh flap is configured by be deflected as a material passes through the tunnel and then returning to a resting, closed position when the material is no longer passing through the tunnel.

According to a second aspect of the present disclosure, an apparatus for treating material is disclosed. According to the second aspect, the apparatus for treating material includes a conveyor unit including a helical auger having an auger shaft provided along an auger rotational axis, the auger configured to rotate in a direction such that a quantity of material received at the conveyor unit is caused to be transported according the auger rotational axis. Also according to the second aspect, the apparatus includes at least one microwave energy generator, each microwave energy generator being operatively connected to a respective microwave guide configured to cause microwaves emitted by the microwave energy generator to heat the material within the conveyor unit by converting the microwaves to heat when absorbed by at least a portion of the quantity of material within the conveyor unit. Also according to the second embodiments, the quantity of material is heated using the microwave energy, and the quantity of material is caused to exit the conveyor unit after being heated to a target temperature.

According to a third aspect a method of making a bituminous mix is disclosed. According to the third aspect, the method includes receiving a quantity of recycled asphalt paving (RAP) at a conveyor unit comprising an auger, where the RAP passes through at an inlet microwave suppression tunnel before entering the conveyor unit. The method also includes transporting the quantity of RAP along the conveyor unit by causing the auger to rotate. The method also includes heating the quantity of RAP within the conveyor unit using at least one microwave generator operatively connected to a respective microwave guide configured to cause microwaves emitted by the microwave energy generator to heat the quantity of RAP within the conveyor unit by converting the microwaves to heat when absorbed by at least a portion of the quantity of RAP within the conveyor unit. The method also includes causing the heated quantity of RAP to exit the conveyor unit through an outlet microwave suppression tunnel, where the quantity of RAP that exits the conveyor unit is a bituminous mix.

DESCRIPTION OF THE DRAWINGS

FIG. 8 is a cross-sectional side view of a U-shaped microwave suppression tunnel of an outlet side.

FIG. 9 is a cross-sectional top view of the U-shaped microwave suppression tunnel of FIG. 8.

FIG. 10 is a cross-sectional side view of a U-shaped microwave suppression tunnel of an inlet side.

FIG. 18 is another view of the RFI shielding mesh of FIG. 17.

DETAILED DESCRIPTION

Figure 1:
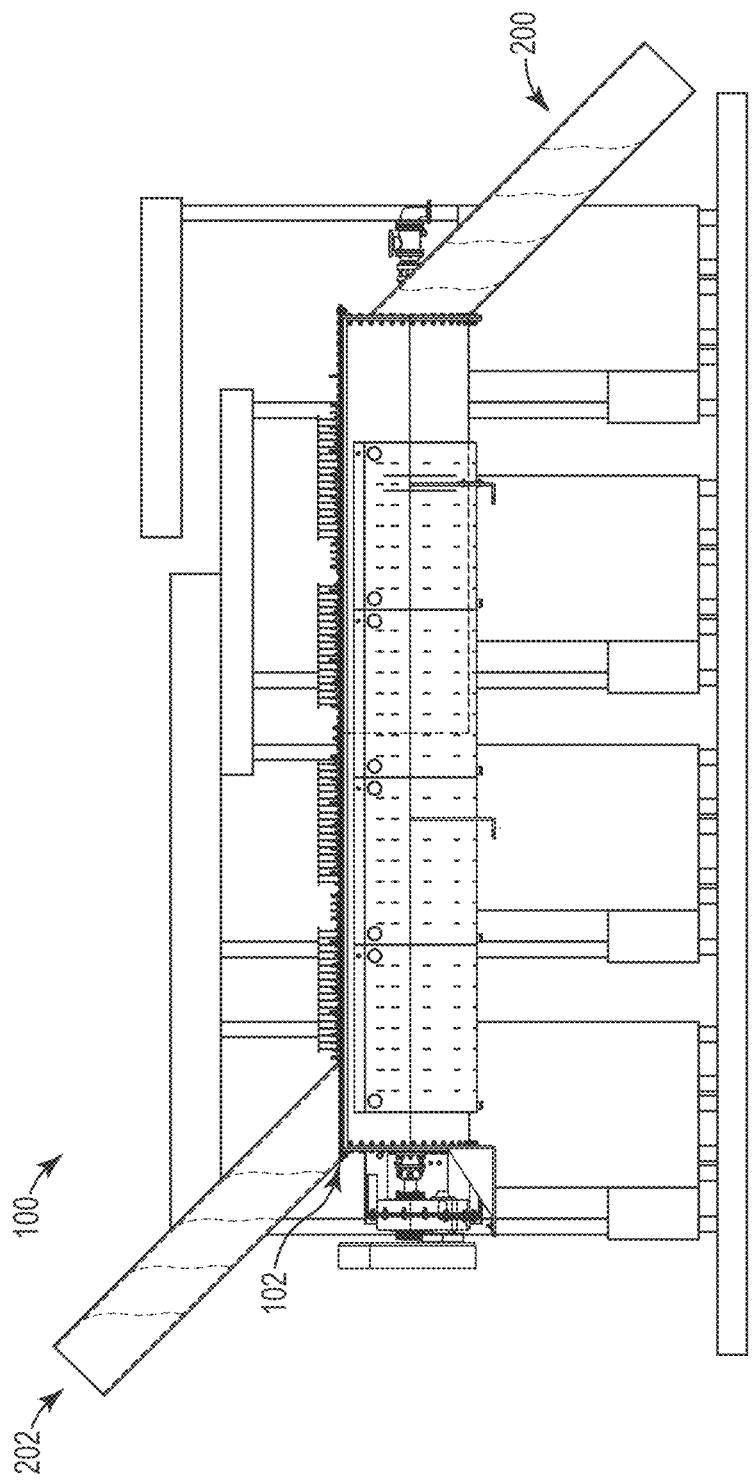
FIG. 1 is a side view of a portable, continuous asphalt mix system, according to various embodiments.
Figure 2:
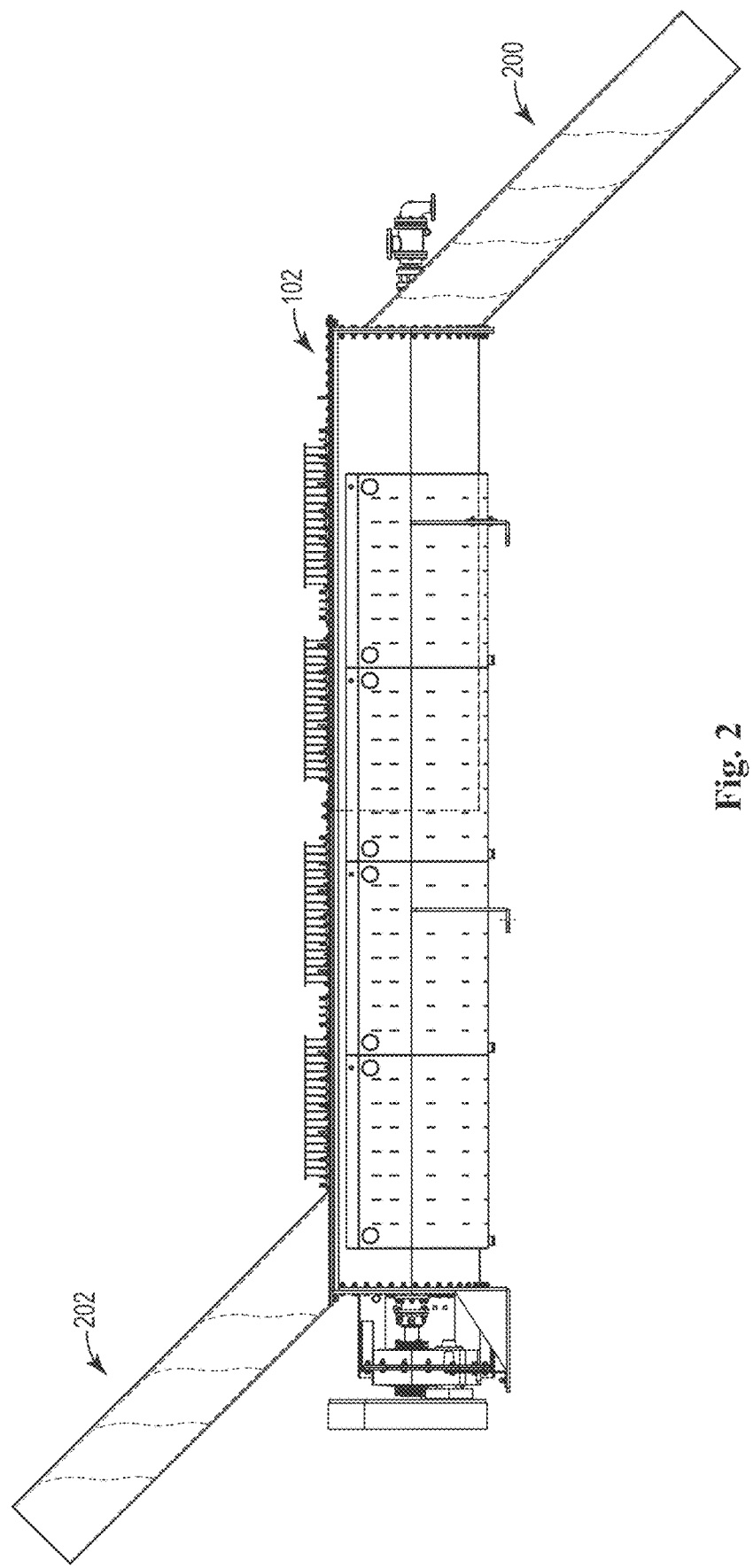
FIG. 2 is a side view of trough and suppression tunnel components of the continuous asphalt mix system of FIG. 1

According to the present disclosure, a problem currently exists in the art relating to microwave emissions escaping a heating system. At high material flow rates in a continuous production system, microwave energy leakage can be particularly undesirable.

According to the present disclosure, various microwave suppression inlet/outlet tunnels can be sized to accommodate the size of the flow of whatever product or material is being processed, such as Reclaimed Asphalt Pavement (RAP) or Reclaimed Asphalt Shingles (RAS), virgin aggregate, or sand, all of which can be components of a bituminous mix. In some cases, a microwave heating system of the present disclosure can be configured to process/heat about 100 tons of RAP per hour or more, although it would be obvious to one skilled in the art that the process could be scaled to accommodate quantities of less than 100 tons per hour.

One or more microwave suppression systems (e.g., tunnels or chutes) comprising one or more (e.g., flexible and/or movable) fabric and/or mesh flaps can be used at one or more openings within a microwave-based heating system in order to reduce microwave emissions that would otherwise reach the outside of the heating system. Each microwave suppression system can comprise a flap or series of flaps that are capable of and configured to cover one or more inlets and/or outlets from a microwave heating system. The microwave suppression systems can prevent or suppress the escape of microwave emissions from the heating system. Therefore, one or more of the fabric and/or mesh flaps can be positioned at outlets and/or inlets of the continuous microwave heating system. Each flap can be generally shaped to conform to a shape of a corresponding suppression tunnel, chute, or the like.

Outlets and/or inlets of the continuous microwave heating system can include one or more suppression tunnels. In particular, moisture-laden material, aggregate, RAP, RAS or other bituminous mix component particles or material can be allowed to enter into the heating region of microwave heating while microwaves are simultaneously substantially prevented from escaping a heating trough via the suppression tunnels within the system. In preferable embodiments, separate suppression systems such as tunnels are supplied and connected to both an inlet and an outlet of a system. In other embodiments, additional suppression tunnels or related features can be included intermediately to the system such that more than two such suppression systems are included in order to maximize microwave suppression from openings in the system. It is known that microwave energy is particularly efficient for heating water (e.g., water molecules), which leads to efficient microwave heating of materials that include at least some of such water molecules. Water can escape a material in the gaseous form of steam when the water is heated to its boiling point (e.g., about 212 degrees Fahrenheit (° F.)). Steam can escape from a heating system through ventilation, and in some cases by forced ventilation through positive or negative pressure applied to the system (e.g., a hot air blower or fan to expedite or assist ventilation). Vents can also be added to improve ventilation and facilitate steam escape characteristics. However, excessive quantities of water can have a negative effect on heating various RAP, RAS, and other materials. Furthermore, heat exchangers can be used to reclaim heat released as steam (or otherwise) during microwave heating processes, and in particular heat that is emitted from the phase change (e.g., boiling) of water when the material containing at least some water is heated.

In some typical cases, RAP can be about 3-8% water content, and in other cases emulsified asphalt, which may also include a softening agent, can be added to improve mixing efficiency. The addition of emulsified asphalt containing the softening agent (if used) can contribute additional water content. The emulsified asphalt and softening agent may be added at 0.5 to 5% by weight of the solid bituminous mix components being added to the microwave heating system. The emulsified asphalt and softening agent can contain water used to produce the emulsion and the water content can be typically between 20% and 80% with another, optional component being a blend of asphalt and softening agent. If, for example 2% of an emulsified asphalt and softening agent that contains 50% water is added to the solid bituminous mix components then an additional 1% water would have been added to the material flowing through the heating system. Other amounts of emulsion will incorporate different amounts of water depending on the amount of emulsion added and amount of water present in the emulsion.

Heating a quantity of material or asphalt product (such as RAP) to a temperature above the boiling point of water (about 212° F.) can therefore be less efficient because the water particles boil off and escape as steam. During heating to certain temperatures, e.g., at or above a boiling point, the number of small dipole molecules (e.g., water) that the microwaves can easily heat through oscillation can decrease. Heating of the material or product then becomes reliant on the microwaves oscillation larger particles which may require more energy. More water is therefore removed from the heated asphalt product as heating temperature increases. A phase change of liquid water to gaseous steam can occur around 180-200° F., and it can be desirable to heat a material, e.g., an asphalt product, to about 225-275° F., according to various embodiments. Steam that is produced from the heating can escape the heating system via vents once the phase change occurs. The steam can exit the system by natural and/or forced ventilation. In some cases, there may be little or no bituminous emissions below about 250° F., or at a maximum below about 270-275° F.

According to various embodiments the material to be heated and/or processed is an aggregate material. In certain embodiments the material can be various particles, such as particles to be heated. The material can be composed of various particulate materials. Examples of the aggregate material can comprise at least some RAP, which can comprise various mixtures of the various particulate materials. The RAP can comprise between 1%-10% asphalt binder for a fractionated or non-fractionated RAP. Optionally, the RAP comprises aggregate and 2.5%-7.0% asphalt binder based on the use of a fractionated or non-fractionated RAP. In some embodiments the RAP is crushed RAP, milled RAP, or a blend of both.

In some embodiments, the material can comprise a bituminous mix, which can comprise virgin aggregate, virgin binder, and/or recycled or reclaimed bituminous materials such as RAP and/or RAS. The material in some embodiments can comprise other non-bituminous material additives to improve final bituminous mix properties. As used herein, "aggregate material" is intended to be used generally, and can refer to any material, particles, mixture, aggregate, or any other suitable material that can be heated using microwave energy as described herein. Aggregate material can be any flowable material in various embodiments.

In some embodiments, the aggregate material comprises at least some virgin aggregate material and/or virgin bitumen. In some embodiments, at least some binder material is added to the aggregate material, e.g., within the system. In further embodiments, the aggregate material comprises at least some additive, such as a recycling additive. The additive can be selected from the group consisting of: a recycling additive, a compaction aid additive, softening additive, anti-strip, and a cold-weather aid additive. In further embodiments, at least a quantity of virgin aggregate material is added to the aggregate material within the system. In yet further embodiments, the aggregate material comprises at least one of RAS and RAP. In some embodiments, at least one of the group consisting of: virgin aggregate, virgin binder, softening additive, and age retarding additives is added to a quantity of RAP before being caused to exit a conveyor unit. In some examples, the age retarding additive comprises blends of pure phytosterols or blends of pure phytosterols and crude sterols, where the crude sterols are derived from tall oil pitch of distillation residue of plant derived oils including soybean oil, corn oil, sunflower seed oil, rape seed oil or similar plant derived oils.

In some embodiments, one or more additives can be added to asphalt products to be heated and at various stages during processing. Various additives can provide a number of different qualities when added to material being processed. For example, additives can increase microwave energy absorption and efficiency during heating. Other additives can provide softening. Some examples of additives include sterol, bitumen, bio-derived products, petroleum-derived products, softening oils, and/or rejuvenating compositions. One illustrative example of an additive that can be added to various asphalt products include taconite tailings, and/or minerals that have magnetic qualities such as graphite, magnetite, and hematite, which can have a higher affinity for microwaves yet do not substantially result in the dissipation of heat as the vaporization of water would.

In some embodiments, a continuous microwave heating process can include dwell time, ramp-up time, hold time, and various heating peaks. Mixing of various asphalt products and mixtures can improve performance during microwave heating, according to some embodiments.

A conventional continuous microwave heating system sized in order to get a maximum throughput is limited to the physical size of the product being heated and weight per time (e.g., pounds per hour) of said product. This can be due to limitations of existing tunnel design. Therefore, a mesh or fabric flap design of an inlet microwave suppression tunnel 202 and/or an outlet microwave suppression tunnel 200, as shown in FIG. 1, are better suited for high-volume continuous flow of various sized products. Microwave suppression tunnel 200 is an example of a microwave suppression system as used herein. Also as shown in FIG. 1, multiple flaps can be used in a single microwave suppression tunnel 200, e.g., four positioned sequentially as shown. Each flap is preferably shaped to conform to a shape of a corresponding suppression tunnel 200, chute, or the like.

Drying, heating, and mixing of not only bituminous mix is contemplated herein, but also the drying of sugar beets, wood pulp, potatoes, corn, oats, other grains, shredded or chipped used tires or any other particulate materials that require drying. Additionally, sanitization, pasteurization, etc. of various materials or products is also contemplated. Yet additional usages of the present disclosure relates to the mining industry, such as using microwaves to fracture rock/mineral, etc.

FIGS. 1-7 illustrate an embodiment of a portable, continuous asphalt mix system 100 having a vessel or trough 102 comprising a microwave heated apparatus with one or more microwave heating units each with a corresponding waveguide to define a guide path for a microwave. As shown, the continuous asphalt mix system 100 also includes an inlet suppression tunnel 202 and an outlet suppression tunnel 200.

An auger 106 or (e.g., a helical screw) is one option for a conveyance mechanism by which particles can be caused to pass through the trough 102 longitudinally. The auger 106 can be completely covered in particles to be heated during operation, but the particles are not shown for clarity. The outlet suppression tunnel 200 can be connected to an outlet and/or inlet of trough 102. The trough 102 can be level or can be canted at an angle to the horizontal plane according to various embodiments. FIGS. 2-7 show various components of the trough 102, auger 106, inlet suppression tunnel 202, outlet suppression tunnel 200, and other components of the system 100 in greater detail. Selected embodiments and variations of the inlet suppression tunnel 202 and the outlet suppression tunnel 200 and components thereof are shown in yet greater detail with respect to FIGS. 8-16C.

Various embodiments of a continuous asphalt mix system 100 include a conveyor unit comprising a vessel or trough 102, one or more microwave heating units and associated waveguides, an auger 106 or other suitable conveyor system, an inlet suppression tunnel 202, and an outlet suppression tunnel 200. These and other components are described in greater detail herein.

Figure 3:
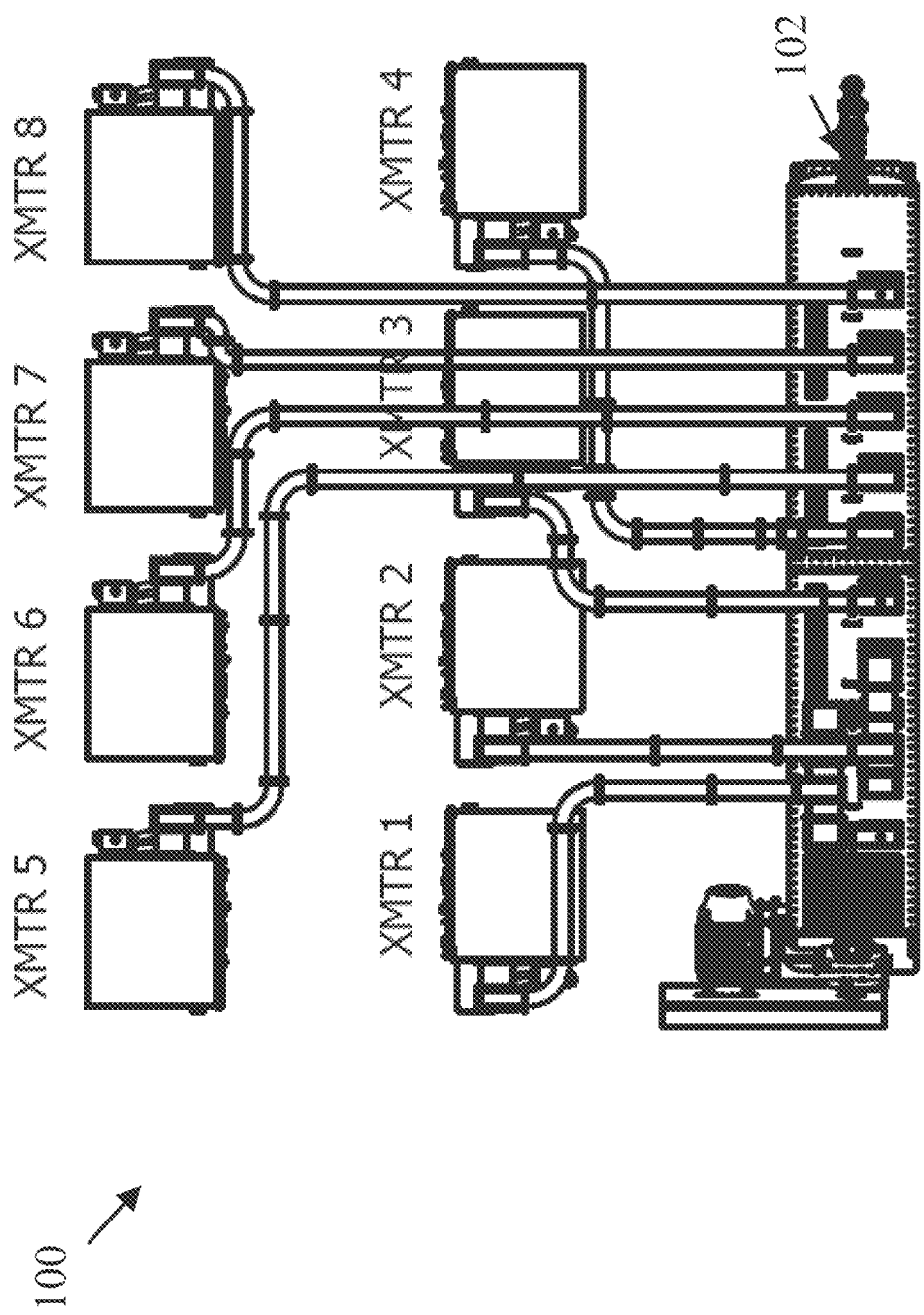
FIG. 3 is a top view of the continuous asphalt mix system of FIG. 1.

FIG. 3 shows the general configuration of a continuous heating system 100 of the present description, including eight microwave heating units, a microwave waveguide for each heating unit, an auger-based continuous heating assembly, and various other components. In particular, FIG. 3 shows an example including eight microwave heating units labeled as XMTR 1, XMTR 2, XMTR 3, XMTR 4, XMTR 5, XMTR 6, XMTR 7, and XMTR 8. More or fewer microwave heating units (and corresponding waveguides) can be used in alternative embodiments. One example microwave heating unit can be provided by Thermax Thermatron. The microwave heating units can be built in a large variety of shapes and sizes according to the requirements of a continuous heating process. Each microwave heating unit can preferably apply about 100 kW of power to the product being heated and operates at about 915 MHz.

Various waveguide configurations and embodiments are shown in FIGS. 1 and 3. The various waveguides can be configured to bend and be routed such that no two waveguides collide, and in some cases the waveguides can be configured to minimize turns or bends in the waveguides, as practical.

FIG. 1 is a side view of the continuous heating assembly, including an example inlet suppression tunnel 202, outlet suppression tunnel 200, and trough 102 of system 100. Although not shown, the trough 102 can be mounted or positioned at an angle to facilitate asphalt movement or production during the heating process, e.g., by at least partially utilizing gravity to move the asphalt of other material through the trough 102.

Figure 4:
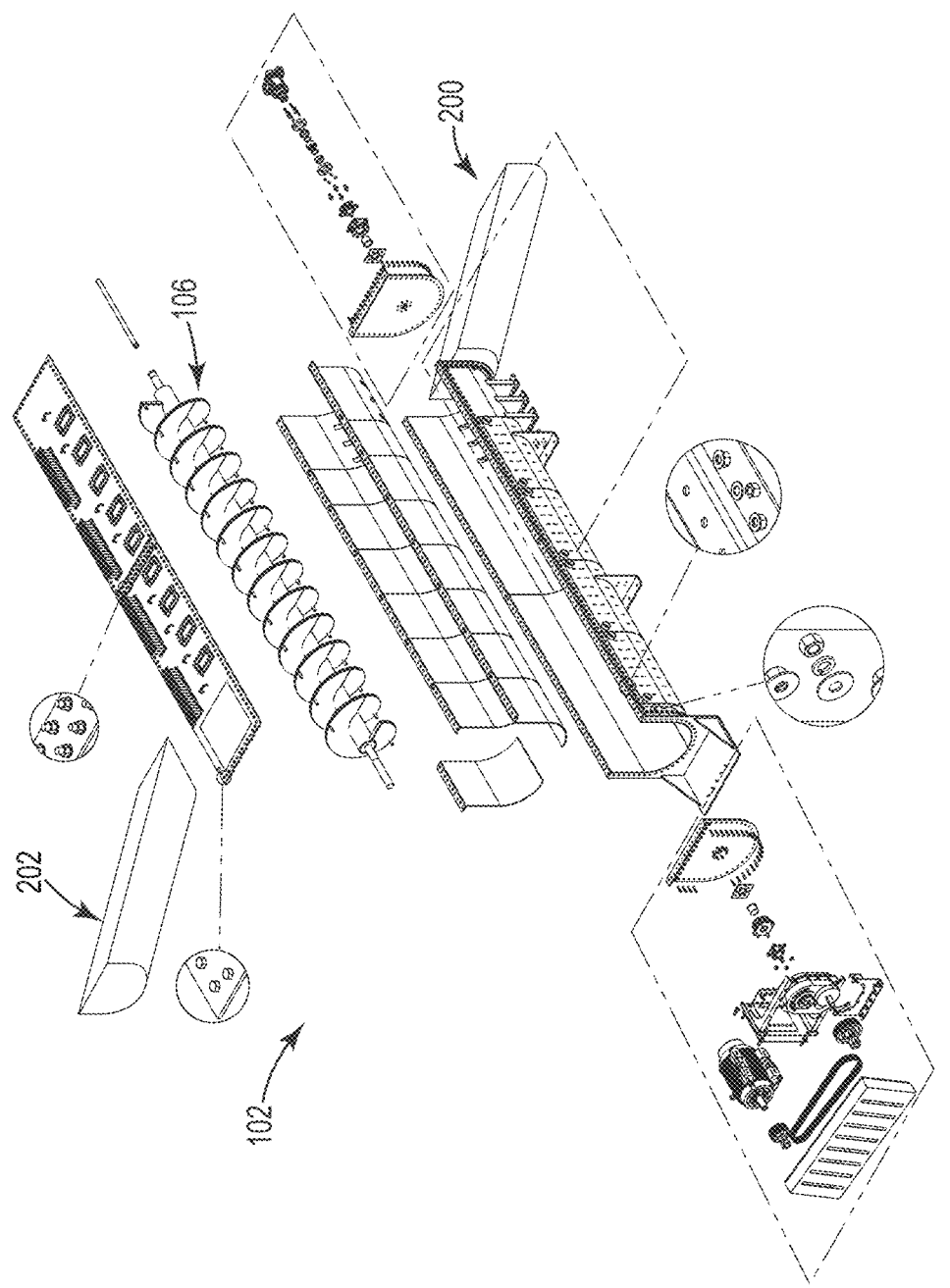
FIG. 4 is a perspective exploded view of the trough of the continuous mix system of FIG. 1.

FIG. 4 is an exploded view of system 100. Shown is a motor for rotating the auger 106, the trough 102 for carrying the asphalt to be heated, the inlet suppression tunnel 202, the outlet suppression tunnel 200, and various other components. In particular, FIG. 4 provides a more detailed view of trough 102.

Figure 5:
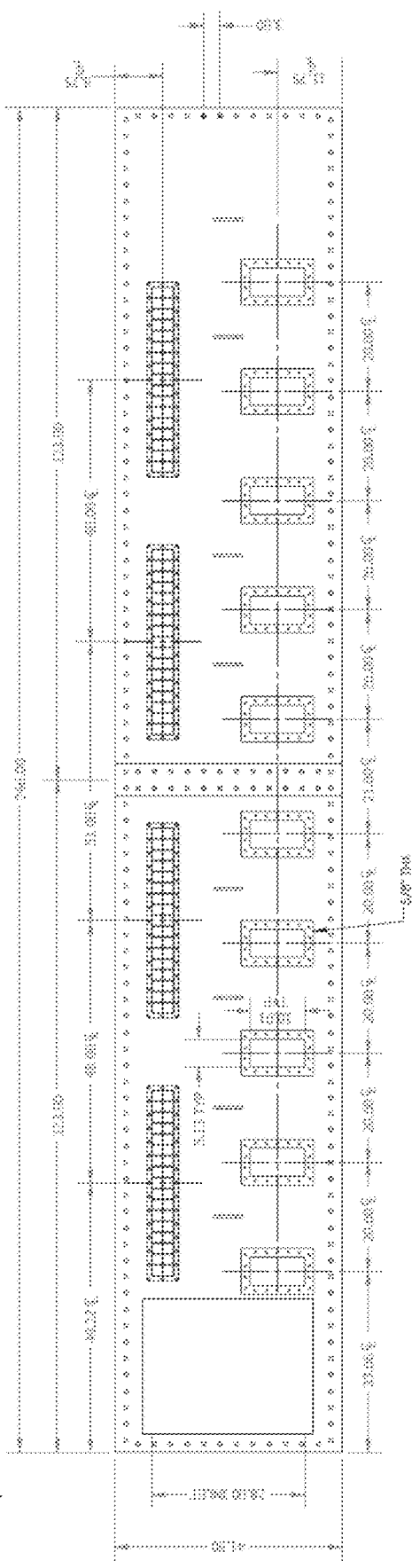
FIG. 5 is a top view of the trough of the continuous mix system of FIG. 1.

Various entry points for microwaves via the multiple waveguides in trough 102 are shown in FIG. 5.

Figure 6:
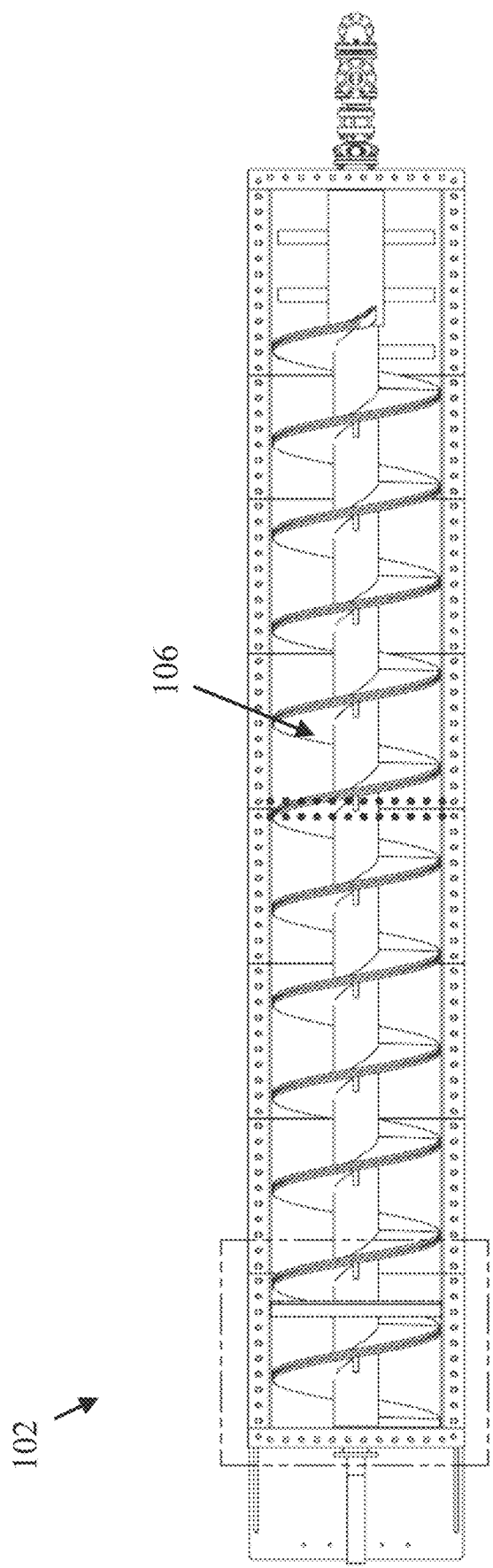
FIG. 6 is a top view of an auger for use with the trough of the continuous mix system of FIG. 1.

In the configuration of FIG. 6, the trough 102 of the continuous heating assembly of system 100 includes an auger 106. The auger 106 can optionally be heated and used to cause asphalt to be heated using liquid and/or microwave heating to be moved longitudinally along the trough 102 during heating or production. The auger 106 can also be caused to rotate directly or indirectly by a motor or engine, according to various embodiments. Furthermore, the auger 106 can be caused by the motor/engine to rotate more slowly or more quickly according to various parameters, which can be based on need or usage. As shown, a fluid connection can be attached to one or more ends of the auger 106, which can be used for additional auger-based heating or cooling of asphalt being produced or heated.

Figure 7:
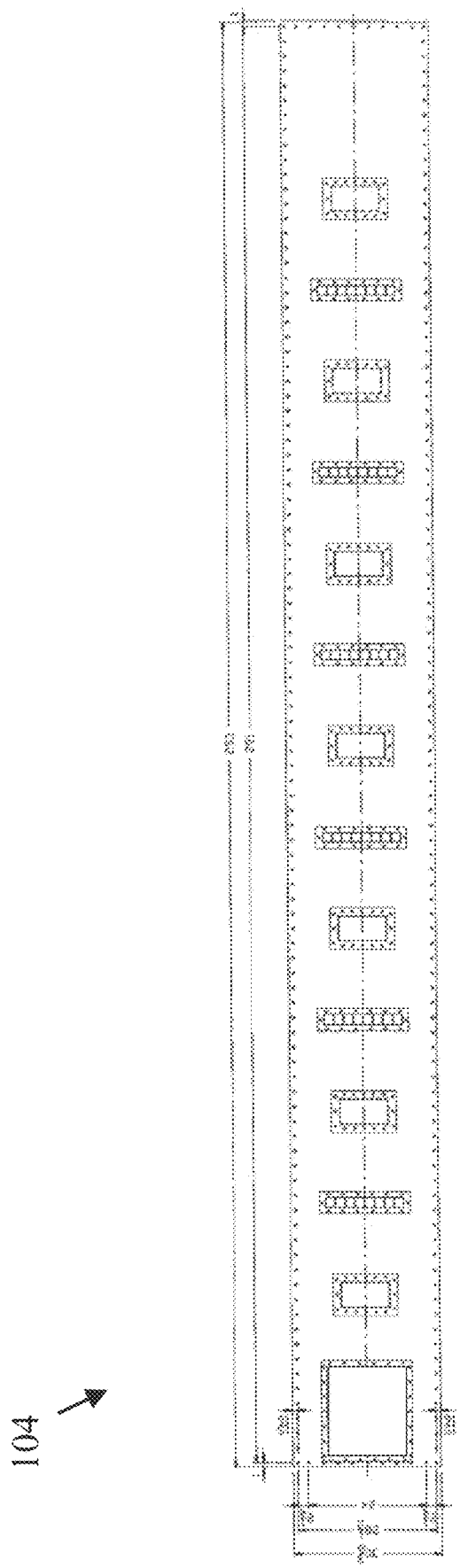
FIG. 7 is a top view of an alternative configuration of the trough of the continuous mix system of FIG. 1.

FIG. 7 is a top view of an alternative configuration of the trough 102 of FIG. 4 where various apertures within an alternative trough 104 cover are instead positioned in alternative locations.

FIG. 8-13 illustrate various arrangements of microwave absorbing, deflecting, or blocking flaps, variously including inlet (e.g., 202) and outlet suppression tunnel (e.g., 200) embodiments.

FIG. 8 is a cross-sectional side view of a U-shaped microwave suppression tunnel 200 of an outlet side. As shown, a series of four, single-ply (e.g., single layer) microwave suppression flaps 214 are shown in the outlet suppression tunnel 200 in a down position. At hardware detail section 400 of FIG. 14, flaps 214 can be attached to a top outlet side portion 216 of the outlet suppression tunnel 200 along with attachment hardware including bolt fastener 206, nut 208, bolt washer 210, metal bracket 212, and shielding mesh flap 214. As used herein, the inlet suppression tunnel 202 and the outlet suppression tunnel 202 can be operatively similar and the features of either can be incorporated into the other in various embodiments. For example, although the inlet suppression tunnel 202 is shown with a single flap 218, multiple flaps 218 can be used in the inlet suppression tunnel 202 among other features of the outlet suppression tunnel 200.

FIG. 9 is a cross-sectional top view of the U-shaped microwave outlet suppression tunnel 200 of FIG. 8. As shown, multiple attachment points (e.g., using hardware shown at FIG. 14) for each flap 214 are contemplated, although any suitable attachment or arrangement for the flap 214 is also contemplated herein.

FIG. 10 is a cross-sectional side view of a U-shaped inlet microwave suppression tunnel 202 for use with or connection to an inlet side of a conveyor unit, such as of the system 100. System 100 described above with reference in particular to FIGS. 1-4, can have inlet and outlet ends of a continuous motion particle pathway (e.g., motivated by auger 106 or other conveyance mechanism of the conveyor unit), an inlet suppression tunnel 202 can be used with or without an outlet suppression tunnel 200 as shown in FIGS. 8 and 9. A single, single-ply (e.g. single layer) microwave suppression flap 218 is shown in FIG. 10 attached to a top inlet side portion 217, e.g., using hardware as shown and described with respect to FIG. 14, below. As shown in the embodiments of FIGS. 8-10, the suppression tunnels 200 and 202 use a single-ply (e.g., single layer) microwave-absorbing, deflecting, or blocking mesh flap 214 or 218, respectively.

Figure 13:
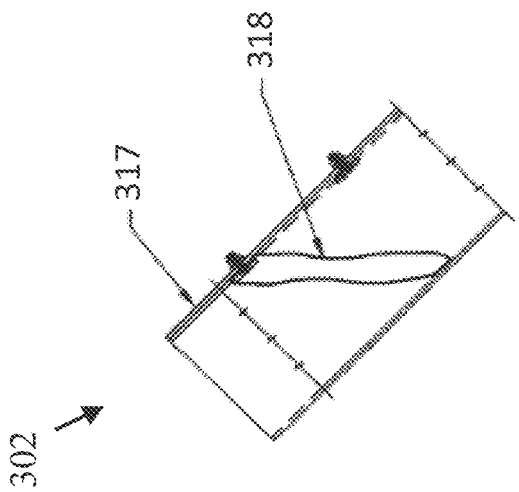
FIG. 13 is a cross-sectional side view of a rectangular microwave suppression tunnel of an outlet side.
Figure 12:
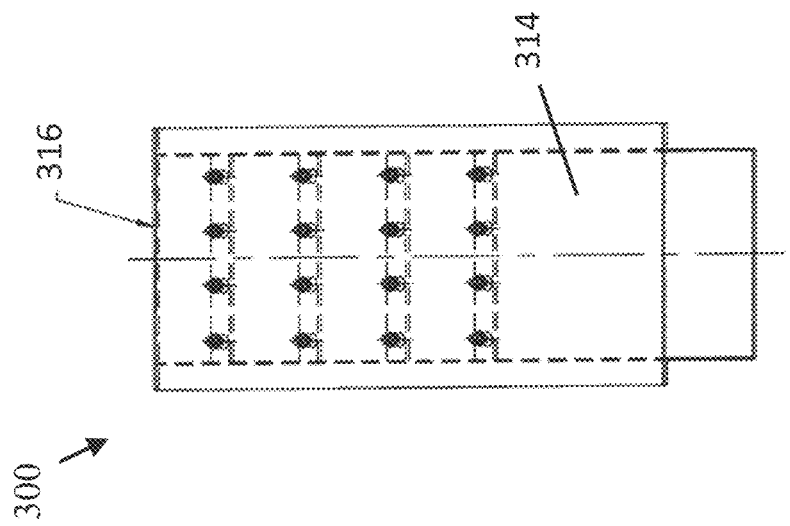
FIG. 12 is a cross-sectional top view of a rectangular microwave suppression tunnel of FIG. 11.
Figure 11:
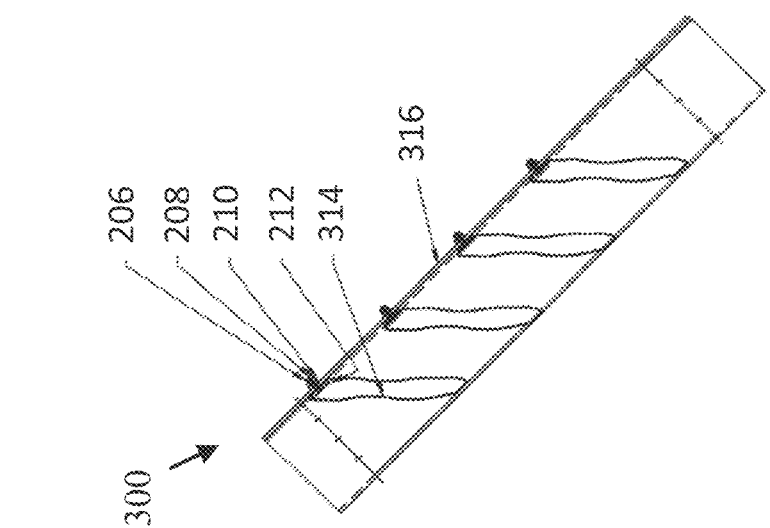
FIG. 11 is a cross-sectional side view of a rectangular microwave suppression tunnel of an inlet side.

FIGS. 11-13 illustrate alternative embodiments where mesh flap(s) 314, 318 are doubled over as two-ply for increased microwave absorption. FIGS. 11-13 are similar to FIGS. 8-10, respectively, with the exception of the folded over, two-ply (two layer) mesh flap(s) 314, 318.

FIG. 11 is a cross-sectional side view of a rectangular outlet microwave suppression tunnel 300. Four flaps 314 are shown, and each flap 314 can be attached to a top portion 316 of the outlet suppression tunnel 300 along with attachment hardware including bolt fastener 206, nut 208, bolt washer 210, metal bracket 212, and shielding mesh flap 314.

FIG. 12 is a cross-sectional top view of the rectangular microwave outlet suppression tunnel 300 of FIG. 11. FIG. 13 is a cross-sectional side view of a corresponding rectangular microwave inlet suppression tunnel 302. As shown, folded flap 318 is attached to top outlet side 317.

Figure 14:
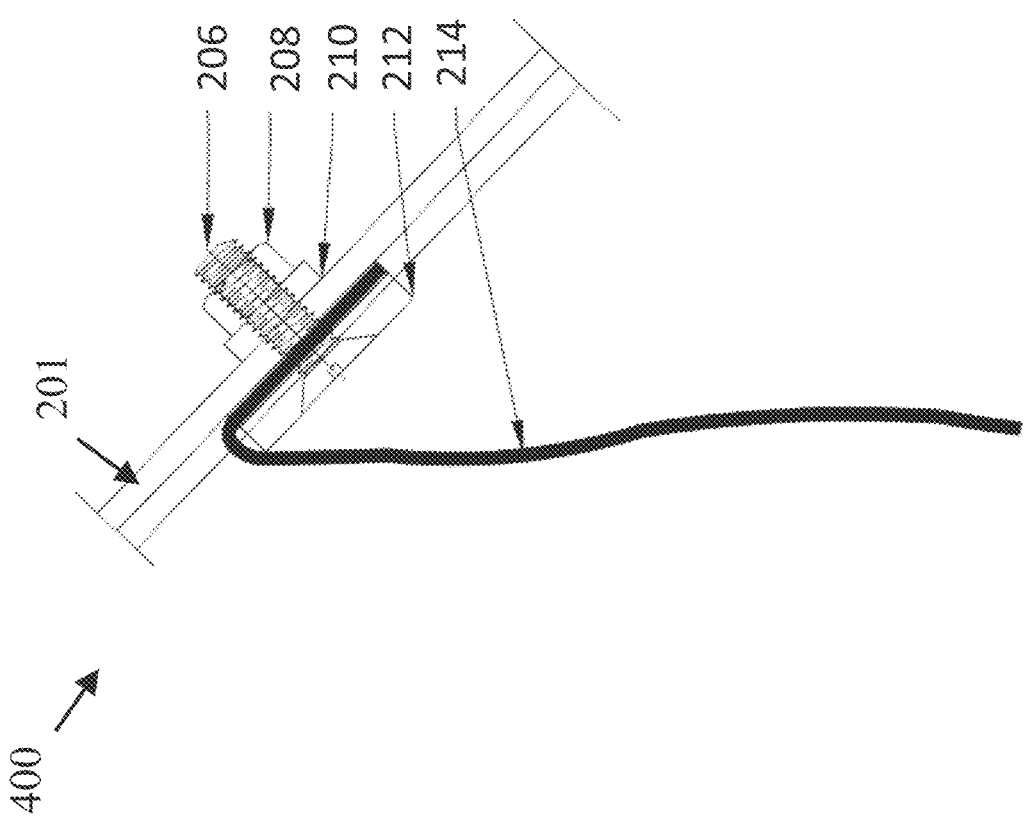
FIG. 14 is a schematic side view of a hardware detail section of a non-looped microwave absorbing flap with a mesh attached to a microwave suppression tunnel.
Figure 15:
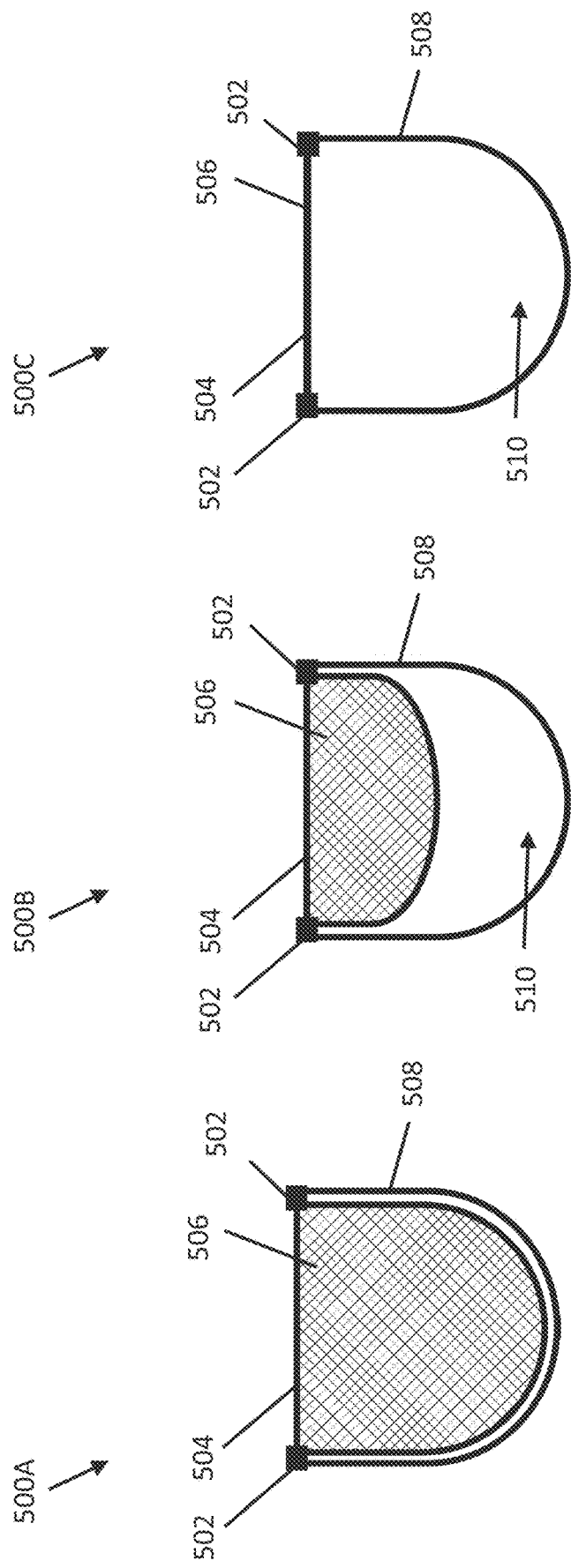
FIG. 15A is a cross-sectional end view of a U-shaped microwave suppression tunnel configuration with a top-mounted pivoting mesh flap in a closed position.
FIG. 15B is a cross-sectional end view of the U-shaped microwave suppression tunnel configuration of FIG. 15A with the mesh flap in a partially open position.
FIG. 15C is a cross-sectional end view of the U-shaped microwave suppression tunnel configuration of FIG. 15A with the mesh flap in a fully open position.
Figure 16:
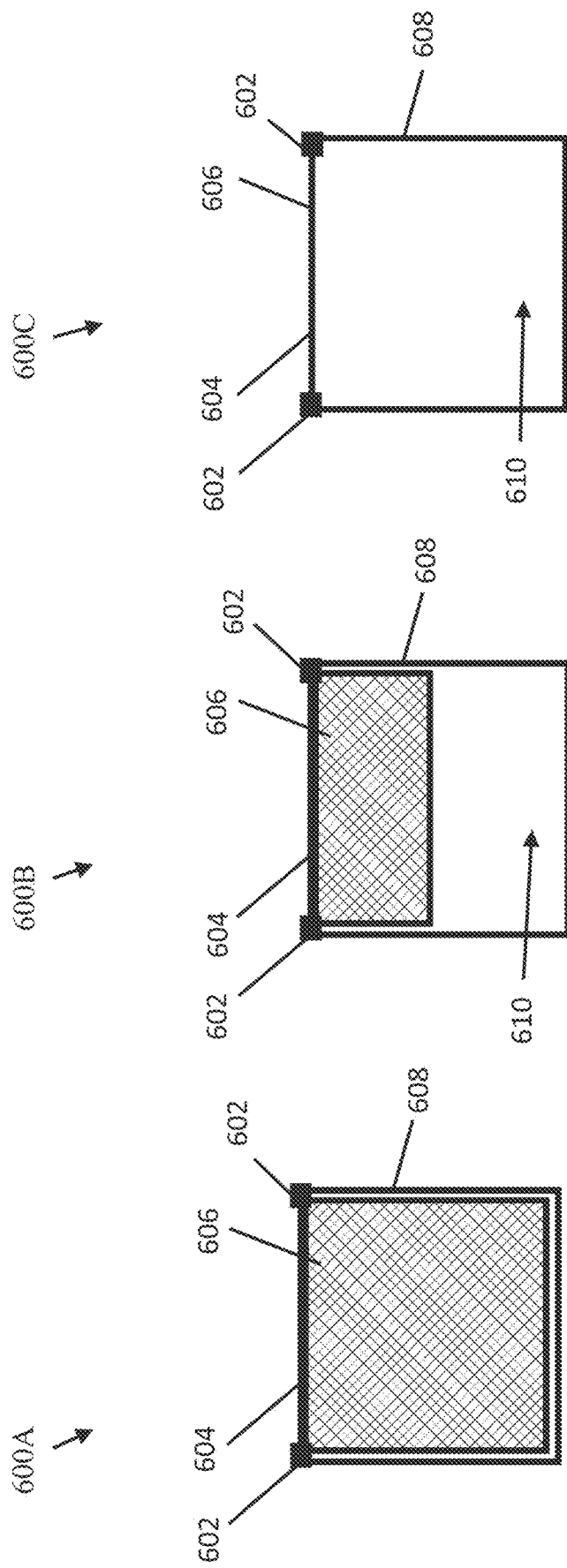
FIG. 16A is a cross-sectional end view of a rectangular microwave suppression tunnel configuration with a top-mounted pivoting mesh flap in a closed position.
FIG. 16B is a cross-sectional end view of the rectangular microwave suppression tunnel configuration of FIG. 16A with the mesh flap in a partially open position.
FIG. 16C is a cross-sectional end view of the rectangular microwave suppression tunnel configuration of FIG. 16A with the mesh flap in a fully open position.

FIG. 14 shows greater detail of hardware detail section 400 of FIG. 8. As shown, a flap 214 can be attached to (e.g., a top inlet or outlet side portion) of a suppression tunnel along with attachment hardware including bolt fastener 206, nut 208, bolt washer 210, metal bracket 212, and shielding mesh flap 214. FIG. 14 shows a side view of a non-looped, single-ply microwave absorbing, deflecting, or blocking flap 214 with a microwave-absorbing mesh described in greater detail herein that is attached to a tunnel (or chute, etc.). Only one example fastening arrangement is shown at hardware detail section 400, but other arrangements are contemplated. In other embodiments, the flap 214 with mesh can be looped, causing a two-ply (e.g., two layer) flap to be attached at two ends in a manner similar to the fastening arrangement shown at hardware detail 400.

Flap 214 as shown in FIG. 14 (and any other embodiments of flaps herein) is preferably electrically grounded to a heating system frame 201. The heating system frame 201 is preferably grounded to a power source electrical grid (not shown) according to various embodiments.

Turning now to FIGS. 15A-15C and 16A-16C, various cross-sectional end views are shown that provide detail of flap configuration within a microwave suppression tunnel or chute in addition to flap articulation or flexing that occurs during continuous material (e.g., asphalt) production and movement along the tunnel.

Inlet and/or outlet tunnels (e.g., 202, 200, etc.) can be positioned and connected relative to the continuous heating assembly. During heating operation, it is possible that at least some microwave energy will not be absorbed by asphalt being heated or other components within the assembly. This non-absorbed, escaped, or "leaked," microwave energy can be unsafe, undesirable, or otherwise beneficial to avoid in practice. In order to address this shortcoming, one or more movable and/or pivotable flaps can be positioned at the inlet tunnel, the outlet tunnel, or both.

In various embodiments, an example microwave absorbing, deflecting, or blocking flap, for inlet or outlet of asphalt, can comprise a flexible mesh configured to feely pivot when contacted by moving aggregate material as described herein.

Inlet and/or outlet microwave suppression tunnels can have rounded, rectilinear, or a combination of the two for an outline along the various tunnels.

In various embodiments, suppression tunnels are preferably in a substantially horizontal position, but preferably at an angle of no more than 45 degrees from horizontal.

FIG. 15A is a cross-sectional end view of a U-shaped microwave suppression tunnel configuration 500A with a top-mounted pivoting mesh flap 506 in a closed position. Example attachment points 502 show one alternative mounting configuration that allows flap 506 to pivot within U-shaped flap surround 508. The flap 506 can pivot along a top flap portion or axis 504, or can bend alternatively when a pressure is applied to the flap 506.

FIG. 15B is a cross-sectional end view of a U-shaped microwave suppression tunnel configuration 500B, similar to 500A of FIG. 15A with the mesh flap in a partially open position. As particles are moved along a trough defined by surround 508, flap 506 can be caused to pivot or bend such that an opening 510 between the flap 506 and the surround 508 is revealed. Opening 510 can allow particles to pass while allowing minimal microwaves to escape. Particles causing flap 506 to open can at least partially block microwaves that would otherwise have escaped the microwave suppression tunnel (e.g., outlet suppression tunnel 200 or inlet suppression tunnel 202, among other examples described herein).

FIG. 15C is a cross-sectional end view of the U-shaped microwave suppression tunnel configuration 500C similar to 500A of FIG. 15A with the mesh flap 506 in a fully open position, causing a larger opening 510 than in configuration 500B.

The embodiments shown in FIGS. 15A-15C can also be modified to include a rectangular flap 606 with a corresponding rectangular surround 608, as shown in FIGS. 16A-16C.

FIG. 16A is a cross-sectional end view of a rectangular microwave suppression tunnel configuration 600A with a top-mounted pivoting mesh flap 606 in a closed position. Example attachment points 602 show one alternative mounting configuration that allows flap 606 to pivot within rectangular flap surround 608. The flap 606 can pivot along a top flap portion or axis 604, or can bend alternatively when a pressure is applied to the flap 606.

FIG. 16B is a cross-sectional end view of a rectangular microwave suppression tunnel configuration 600B, similar to 600A of FIG. 16A with the mesh flap in a partially open position. As particles are moved along a trough defined by surround 608, flap 606 can be caused to pivot or bend such that an opening 610 between the flap 606 and the surround 608 is revealed. Opening 610 can allow particles to pass while allowing minimal microwaves to escape. Particles of material causing flap 606 to open can at least partially block microwaves that would otherwise have escaped the microwave suppression tunnel.

FIG. 16C is a cross-sectional end view of the rectangular microwave suppression tunnel configuration 600C similar to 600A of FIG. 16A with the mesh flap 606 in a fully open position, causing a larger opening 610 than in configuration 600B.

Many other microwave suppression system flap and tunnel configurations are also contemplated herein, and the examples above are merely shown as selected examples of preferred embodiments.

Figure 17:
FIG. 17 is a detail view of an RFI shielding mesh according to various embodiments.

FIGS. 17 and 18 show an example stainless steel RFI shielding mesh 700. The mesh 700 can be a carbon cover metal.

For example, the shielding mesh 700 can be sourced from Aaronia USA/Aaronia AG. The shielding mesh 700 can be an 80 dB Stainless Steel RFI Shielding Aaronia X-Steel model, which can provide military or industrial grade screening to meet various demanding usage cases. In some examples, the shielding mesh 700 can be coated with a polytetrafluoroethylene (i.e., PTFE or "Teflon") coating. The steel mesh 700 can be highly durable, effective up to about 600 degrees Celsius (° C.), operate under a very high frequency range, and be permeable to air.

In more detail, shielding mesh 700 is an Aaronia X-Steel component that can operate to at least partially shield both radio frequency (RF) and low frequency (LF) electric fields. Some specifications of the shielding mesh 700 can include a frequency range of 1 MHz to 50 GHz, a damping in decibels (dB) of 80 dB, a shielding material including stainless steel, a carrier material including stainless steel, a color of stainless steel (silver), a width of 0.25 m or 1 m or some variation, a thickness of about 1 mm, available sizes of about 0.25 m$^2$ or 1 m$^2$, a mesh size of approximately 0.1 mm (multiple ply/layer), and a weight of approximately 1000 g/m$^2$. The shielding mesh 700 can be suitably durable, and can be configured and rated for use in industrial or other applications, can have a temperature range up to 600° C., can be permeable to air, and permit very easy handling.

In some examples, the shielding mesh 700 can be EMC screening Aaronia X-Steel from Aaronia AG, which can be made from 100% stainless steel fiber. The shielding mesh 700 can meet various industrial or military standards. The shielding mesh 700 can be very temperature stable for at least 600° C., does not rot, and is permeable to air. The shielding mesh 700 can be suitable for EMC screening of air entrances and can be very high protective EMC clothing, etc. The shielding mesh 700 can protect against many kinds of RF fields and can offer a 1000-fold better shielding-performance and protection especially in the very high GHz range as compared to various other types of shielding mesh. The shielding mesh 700 provides screening within the air permeable EMC screening materials.

Application examples of the shielding mesh 700 include: Radio & TV, TETRA, ISM434, LTE800, ISM868, GSM900, GSM1800, GSM1900, DECT, UMTS, WLAN, etc.

Figure 19:
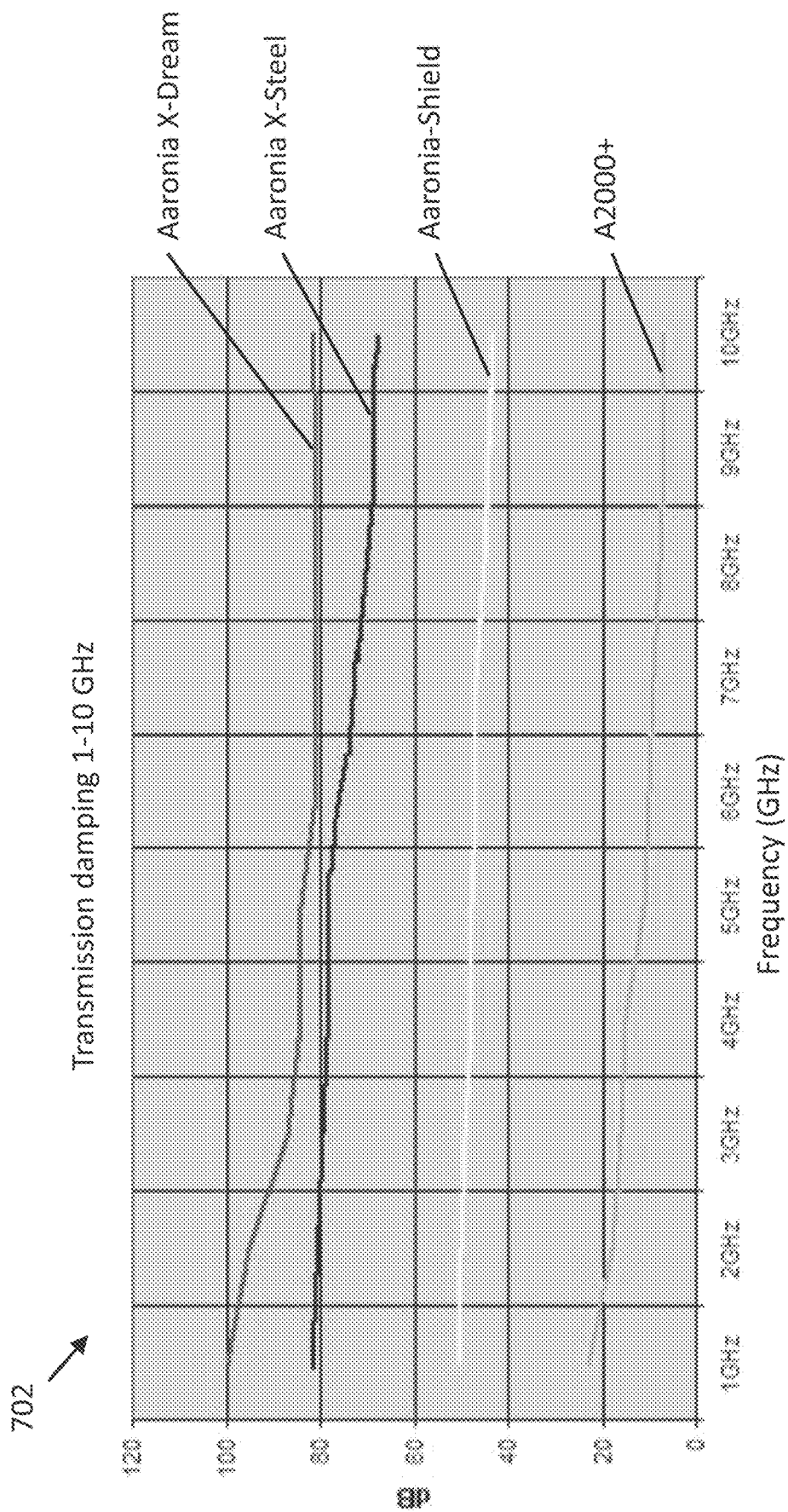
FIG. 19 is a transmission damping chart of the shielding mesh according to FIG. 17.

FIG. 19 shows a transmission damping chart 702 for various shielding mesh examples from 1-10 GHz in terms of dB for the mesh 700 of FIGS. 17 and 18. As shown, four shielding meshes are depicted. As shown, in descending order for transmission damping across 1-10 GHz, are Aaronia X-Dream, Aaronia X-Steel, Aaronia-Shield, and A2000+.

Figure 20:
FIG. 20 is a detail view of another shielding mesh according to various embodiments.
Figure 21:
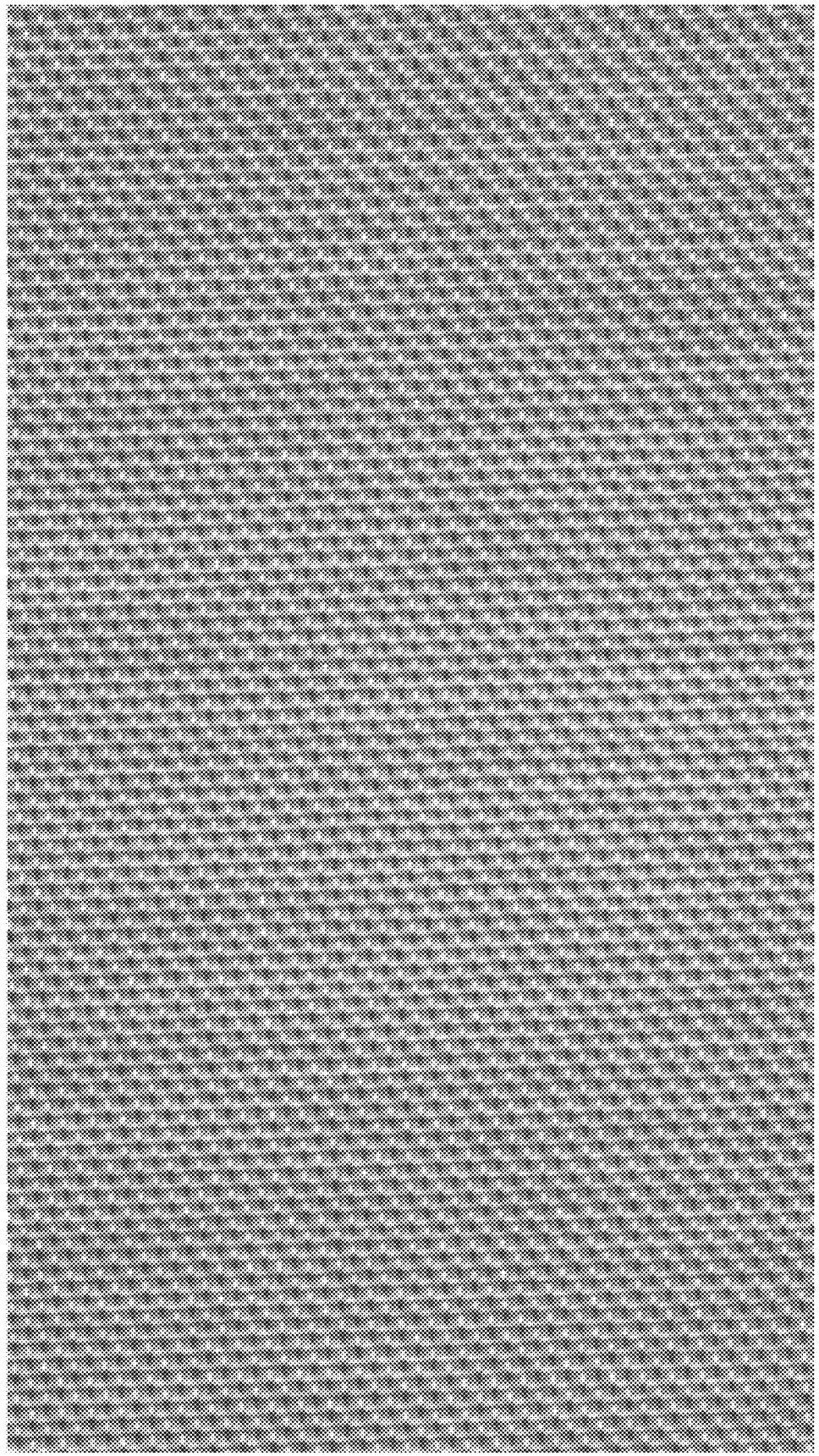
FIG. 21 is another view of the shielding mesh of FIG. 20.

FIGS. 20 and 21 show another example shielding mesh, a fireproof shielding fabric mesh 800.

The fireproof shielding fabric mesh 800 can be sourced from Aaronia AG, and is a stainless steel EMC/EMF shielding mesh for usage under extreme conditions. The fireproof shielding mesh 800 is usable up to 1200° C., can be half transparent, has high attenuation, and is both odorless and rot resistant. The fireproof shielding fabric mesh 800 has microwave attenuation as follows: 108 dB at 1 kHz, 100 dB at 1 MHz, 60 dB at 100 MHz, 44 dB at MHz, 30 dB at 10 GHz Some specifications of the fireproof shielding fabric mesh 800 include: lane Width: 1 m; thickness: 0.2 mm; mesh size: about 0.1 mm, color: stainless steel; weight: approx. 400 g/m; usable until about 1200° C.; yield strength: 220 MPa; tensile strength: 550 MPa; hardness: 180 HB; can be breathable; odorless; transparent; rot resistant; frost proof; washable; foldable; bendable; mesh material: stainless steel.

The fireproof shielding fabric mesh 800 has screening performance for static fields of: 99.9999% to 99.99999% (e.g., when grounded). The fireproof shielding fabric mesh 800 has screening performance for low electric fields of: 99.9999% to 9999999% (e.g., when grounded).

The fireproof shielding fabric mesh 800 is suitable for industrial applications as well as for research and development. The fireproof shielding fabric mesh 800 has been specifically designed for use under various adverse conditions (salt air, extreme temperatures, vacuum, etc.).

The fireproof shielding fabric mesh 800 is made of 100% stainless steel; is temperature stable up to 1200° C., has high microwave attenuation, and is breathable. The material of mesh 800 absorbs reliable E&H fields. In particular, in the kHz and low MHz range mesh 800 offers a high shielding factor of up to 108 dB (E-field). Mesh 800 is easy to process and can be cut with a standard pair of scissors.

Figure 22:
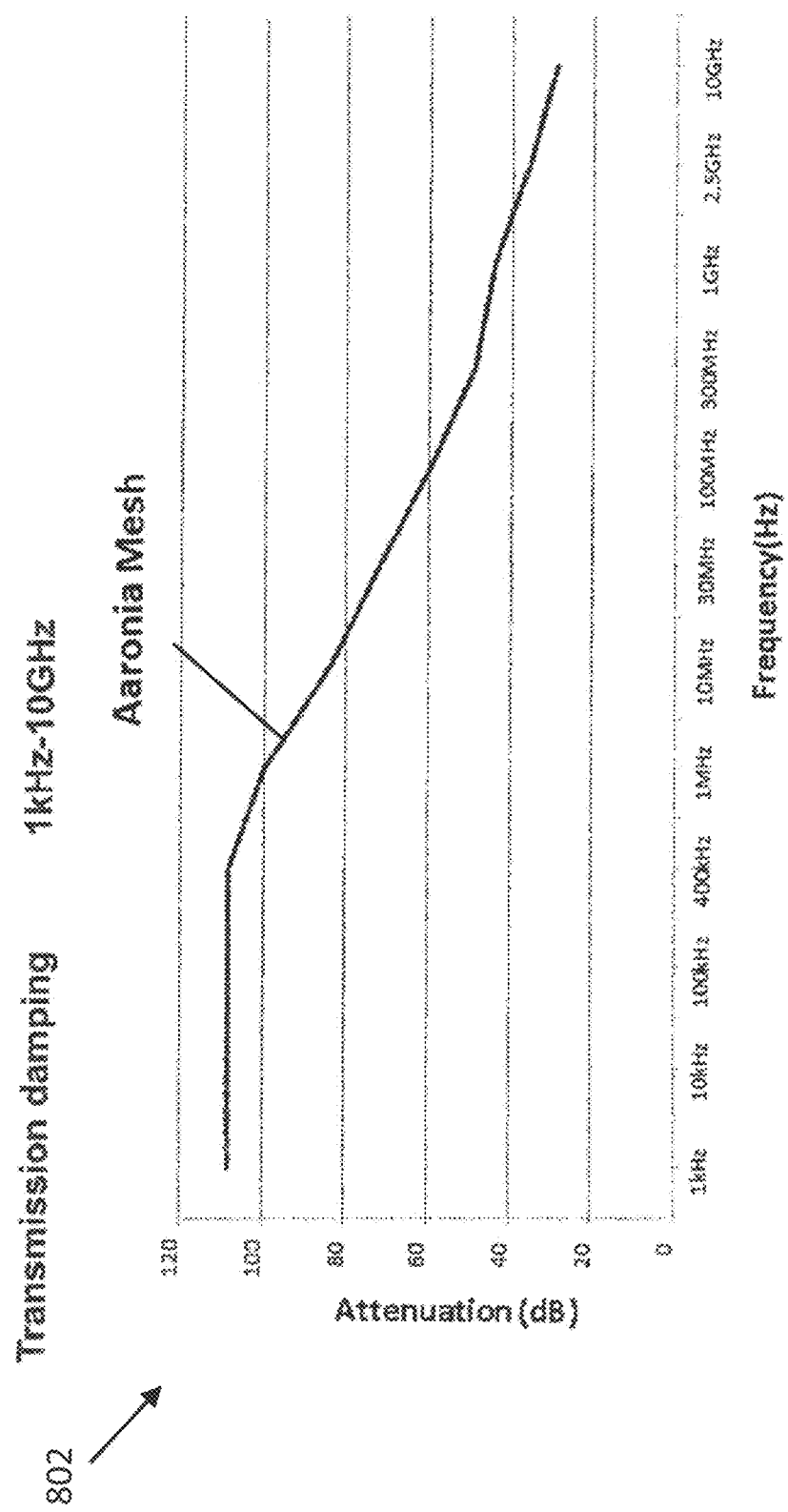
FIG. 22 is a transmission damping chart of the shielding mesh of FIG. 20.

FIG. 22 is a transmission damping chart 802 from 1-10 GHz in terms of dB for the fireproof mesh 800 of FIGS. 20 and 21.

Based on power requirements, two or more microwave power units can be installed on the same auger or conveyor. To assure uniform heat distribution in a large variety of load configurations, a multimode cavity can be provided with a waveguide splitter with dual microwave feed points and/or mode stirrers.

The product or material being heated can be carried in various examples by another type of conveyance mechanism, such as by a unique conveyor belt. Therefore, in some embodiments a conveyorized modular industrial microwave power system can be employed as alternative to an auger-based system such as system 100. The belt material and configuration are selected based on the nature of the product being heated. Each end of the conveyor is preferably also provided with a special vestibule to suppress any microwave leakage. Air intake and exhaust vents or ports are provided for circulating air to be used in cases where vapors or fumes are developed during the heating process.

Common uses of the microwave power system include drying or heating. Applications of the microwave power system include ceramics, catalysts, vulcanizing, composites, bulk fibrous components, sand cores, general drying and heating of electrically non-conductive materials, and research and development.

Unlike home microwave ovens, example industrial microwave systems contemplated herein preferably separate microwave generation from a heating/drying cavity such as a trough or housing. An example industrial microwave heating system can be constructed to use one or more microwave generator units. Example microwave generator units come in 75 kW and 100 kW (output power) models. Using special ducts called waveguides or microwave guides, the microwave energy is carried to one or more industrial microwave cavities. An example cavity is about twelve feet long and five feet wide. In a conveyor belt-based embodiment, a conveyor belt, auger, etc. carries the product through the cavities. A simple example system may include one microwave generator and one cavity, while a larger and/or more complex system may have a dozen generators and six cavities. This inherent modularity provides great flexibility in scaling a system, or building systems, which can be easily expanded in the future.

These and other advantages will be apparent to those of ordinary skill in the art. While the various embodiments of the invention have been described, the invention is not so limited. Also, the method and apparatus of the present invention is not necessarily limited to any particular field, but can be applied to any field where an interface between a user and a computing device is applicable.

The disclosures of published PCT patent applications, PCT/US2017/023840 (WO2017165664), PCT/US2013/039687 (WO2013166489), and PCT/US2013/039696 (WO2013166490) are hereby incorporated by reference.

In alternative embodiments, example microwave suppression flap(s) can be rigid and non-flexible, but can be attached to top portion using hinges or any other articulating hardware as known in the art. Alternative hardware and flap fastening arrangements are also contemplated.

Unless otherwise defined, all technical and scientific terms used herein have the same meaning as commonly understood by one of ordinary skill in the art to which this invention belongs. Although methods and materials similar to or equivalent to those described herein can be used in the practice or testing of the present invention, suitable methods, and materials are described below. All publications, patent applications, patents, and other references mentioned herein are incorporated by reference in their entirety to the extent allowed by applicable law and regulations. In case of conflict, the present specification, including definitions, will control.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention. Those of ordinary skill in the art that have the disclosure before them will be able to make modifications and variations therein without departing from the scope of the invention.

The invention claimed is:

1. An apparatus for processing material, comprising:
   a conveyor unit comprising an auger, the auger configured to rotate such that a quantity of material received at the conveyor unit is caused to be transported according to an axis;
   at least one microwave energy generator operatively connected to at least one microwave guide configured to cause microwaves emitted by the at least one microwave energy generator to apply energy to the quantity of material within the conveyor unit by causing at least some of the applied energy to be absorbed by the quantity of material; and
   at least one microwave suppression system associated with a material inlet/outlet of the apparatus, wherein the material inlet/outlet is associated with at least one flexible and/or movable flap,
   wherein the at least one flap comprises a shielding mesh and is configured to absorb, deflect, or block microwave energy.

2. The apparatus of claim 1,
   wherein the material inlet/outlet is a material inlet of the apparatus.

3. The apparatus of claim 1, wherein the shielding mesh of the flap comprises a metallic shielding mesh.

4. The apparatus of claim 1, wherein the material inlet/outlet is a material outlet of the apparatus.

5. The apparatus of claim 1, wherein the material is processed continuously.

6. The apparatus of claim 1, wherein the auger is a helical auger having an auger shaft provided along the axis.

7. The apparatus of claim 6, wherein the axis is an auger rotational axis.

8. The apparatus of claim 6, wherein the auger shaft defines an internal auger fluid path provided along the axis, and further comprising a fluid management device configured to heat the auger and transfer fluidic heat to the quantity of material through the auger, wherein the quantity of material is heated using a combination of the applied microwave energy and the fluidic heat.

9. The apparatus of claim 1, further comprising a vessel, wherein the auger of the conveyor unit is configured to cause quantity of material to pass through the vessel longitudinally.

10. The apparatus of claim 1, wherein the auger is configured to rotate in a first direction.

11. The apparatus of claim 1, wherein the auger is configured to rotate more slowly or more quickly according to various parameters, and wherein the parameters are based on need and/or usage.

12. The apparatus of claim 1, wherein the quantity of material comprises flowable particles.

13. The apparatus of claim 1, wherein the quantity of material comprises water.

14. The apparatus of claim 1, wherein each microwave energy generator is operatively connected to a respective microwave guide of the at least one microwave guide.

15. The apparatus of claim 1, wherein the at least one flap is electrically grounded to the apparatus.

16. The apparatus of claim 1, wherein the applied microwave energy heats the quantity of material when absorbed.

17. The apparatus of claim 16, wherein the quantity of material is caused to exit the conveyor unit after being heated to a target temperature by the microwave energy applied to the material.

18. The apparatus of claim 1, wherein at least two microwave suppression systems are provided, including an inlet microwave suppression system associated with a material inlet, and an outlet microwave suppression system associated with a material outlet.

19. The apparatus of claim 1, further comprising a tunnel associated with the material inlet/outlet, and wherein the tunnel comprises the at least one flap.

20. The apparatus of claim 19, wherein the at least one flap is configured to be deflected as the quantity of material passes through the tunnel and then to return to a resting, closed position when the quantity of material is no longer passing through the tunnel.

* * * * *